United States Patent
Ryu et al.

(10) Patent No.: US 11,809,050 B2
(45) Date of Patent: Nov. 7, 2023

(54) DISPLAY DEVICE AND METHOD FOR MANUFACTURING SAME

(71) Applicant: Samsung Display Co., LTD., Yongin-si (KR)

(72) Inventors: Seung Soo Ryu, Hwaseong-si (KR); Byoung Yong Kim, Seoul (KR); Sang Duk Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 197 days.

(21) Appl. No.: 17/267,966

(22) PCT Filed: Feb. 8, 2019

(86) PCT No.: PCT/KR2019/001571
§ 371 (c)(1),
(2) Date: Feb. 11, 2021

(87) PCT Pub. No.: WO2020/036277
PCT Pub. Date: Feb. 20, 2020

(65) Prior Publication Data
US 2021/0200006 A1    Jul. 1, 2021

(30) Foreign Application Priority Data
Aug. 14, 2018    (KR) .......................... 10-2018-0095181

(51) Int. Cl.
*G02F 1/1345* (2006.01)
*G02F 1/1333* (2006.01)
*G02F 1/1339* (2006.01)

(52) U.S. Cl.
CPC .......... *G02F 1/1345* (2013.01); *G02F 1/1339* (2013.01); *G02F 1/133302* (2021.01)

(58) Field of Classification Search
None
See application file for complete search history.

(56) References Cited

U.S. PATENT DOCUMENTS 8,465,827 B2    6/2013    Yui et al.
2016/0377905 A1    12/2016    Choi et al.
(Continued)

FOREIGN PATENT DOCUMENTS

CN    10-8363229    7/2021
JP    10-339879    12/1998
(Continued)

OTHER PUBLICATIONS

Extended European search report for European Patent Application or Patent No. 19849494.0 dated Mar. 4, 2022.
(Continued)

*Primary Examiner* — Thanh Nhan P Nguyen
(74) *Attorney, Agent, or Firm* — KILE PARK REED & HOUTTEMAN PLLC

(57) ABSTRACT

A display device according to an embodiment includes a first substrate including a connection line; a second substrate facing the first substrate; and a connection pad connected to a side of surface of the first substrate and a side surface of the second substrate, wherein the connection pad includes a first portion contacting the side of the first substrate and the side surface of the second substrate, and a second portion that is disposed in each of the first substrate and the second substrate and contacting the connection wiring.

20 Claims, 22 Drawing Sheets

(56) References Cited

U.S. PATENT DOCUMENTS

| | | |
|---|---|---|
| 2017/0005083 A1 | 1/2017 | Choi et al. |
| 2017/0082900 A1 | 3/2017 | Kong et al. |
| 2017/0358602 A1 | 12/2017 | Bae et al. |
| 2018/0061367 A1 | 3/2018 | Ye et al. |

FOREIGN PATENT DOCUMENTS

| | | |
|---|---|---|
| JP | 11-095237 | 4/1999 |
| JP | 2015-196620 | 11/2015 |
| JP | 2016-118692 | 6/2016 |
| JP | 2017-528767 | 9/2017 |
| KR | 10-2006-0018409 | 3/2006 |
| KR | 10-2011-0124488 | 11/2011 |
| KR | 10-1431752 | 8/2014 |
| KR | 10-2015-0011731 | 2/2015 |
| KR | 10-2015-0072743 | 6/2015 |
| KR | 10-2017-0050599 | 5/2017 |
| KR | 10-2017-0080937 | 7/2017 |
| KR | 10-2017-0136136 | 12/2017 |
| KR | 10-2017-0139211 | 12/2017 |
| KR | 10-2018-0023109 | 3/2018 |
| TW | 201206848 | 2/2012 |

OTHER PUBLICATIONS

Japanese Office Action corresponding to Japanese Application No. 2021-507496 dated Nov. 22, 2022.
International Search Report corresponding to International Application No. PCT/KR2019/001571 dated May 24, 2019.
Written Opinion, with English translation, corresponding to International Application No. PCT/KR2019/001571, dated May 24, 2019.

DISPLAY DEVICE AND METHOD FOR MANUFACTURING SAME

CROSS-REFERENCE TO RELATED APPLICATION(S)

This application is a national entry of International Application No. PCT/KR2019/001571, filed on Feb. 8, 2019, which claims under 35 U.S.C. §§ 119(a) and 365(b) priority to and benefits of Korean Patent Application No. 10-2018-0095181, filed on Aug. 14, 2018 in the Korean Intellectual Property Office (KIPO), the entire contents of which are incorporated herein by reference.

BACKGROUND

1. Technical Field

The disclosure relates to a display device and a method of manufacturing the same.

2. Description of Related Art

With the development of multimedia, the importance of display devices is gradually increasing. In response to the development, various displays such as liquid crystal display devices (LCDs), organic light-emitting diode (OLED) display devices, and the like are being developed.

An area in which drive integrated circuits (ICs) or other printed circuits are installed is present in a periphery of a glass substrate forming the display device, and this area may be a non-display area in which an image is not displayed and referred to as a bezel. In the case of a tile-type display device which implements a large screen by arranging display devices in a grid type, since the tile-type display device is formed by connecting the display devices, non-display areas in which bezel areas of the display devices are disposed to overlap are formed in a connection portion of the display devices to become a factor which hinders the immersion of a video.

SUMMARY

The disclosure is directed to providing a display device and a method of manufacturing the same, which reduce a bezel area and prevent a connection line and a line layer from being open.

The problems to be solved by the disclosure are not limited to the above-described problem, and other problems not mentioned can be clearly understood by those skilled in the art from the following description.

An aspect of the disclosure provides a display device including a first substrate including a connection line, a second substrate facing the first substrate, and a connection pad connected to a side surface of the first substrate and a side surface of the second substrate. The connection pad may include a first portion contacting the side surface of the first substrate and the side surface of the second substrate, and a second portion disposed in each of the first substrate and the second substrate and contacting the connection line.

The side surface of the first substrate and the side surface of the second substrate may be arranged in a first direction perpendicular to upper surfaces of the first substrate and the second substrate.

An end of the connection line may be disposed in each of the first substrate and the second substrate which are arranged in the first direction.

The display device may further include a recessed portion disposed on the side surface of the first substrate and the side surface of the second substrate.

Each of the first substrate and the second substrate may include glass, and the recessed portion may include a first region exposing a surface of the glass of the first substrate and a second region exposing a surface of the glass of the second substrate.

The recessed portion may include a third region disposed between the first region and the second region and exposing the end of the connection line which is disposed in each of the first substrate and the second substrate.

The display device may further include a dummy pattern disposed between the first substrate and the second substrate, and the recessed portion may include a fourth region disposed between the first region and the third region and exposing the dummy pattern.

The second portion of the connection pad may be disposed along a morphology of the first to fourth regions.

The second portion of the connection pad may contact the surface of the glass of each of the first substrate and the second substrate.

The second portion of the connection pad may contact each of the end of the connection line and the dummy pattern.

The first portion of the connection pad may be a flat portion extending in the first direction, and the second portion of the connection pad may protrude inward from each of the first substrate and the second substrate.

The second portion of the connection pad may contact the surface of the glass of each of the first substrate and the second substrate.

The second portion of the connection pad may contact each of the end of the connection line and the dummy pattern.

Another aspect of the disclosure provides a display device including a first substrate, a second substrate facing the first substrate, a sealing member disposed along an edge region of the first substrate and an edge region of the second substrate and connect the first substrate to the second substrate, and a liquid crystal layer disposed between the first substrate and the second substrate in an inner region of the sealing member. The first substrate may include a first inclined surface which is inclined with respect to each of a first side surface and an upper surface in a first corner region in which the first side surface disposed outside the sealing member and the upper surface facing the second substrate meet each other, and the second substrate may include a second inclined surface which is disposed outside the sealing member and is inclined with respect to a second side surface and a lower surface in a second corner region in which the second side surface aligned with the first side surface and the lower surface facing the first substrate meet each other.

The display device may further include a dummy pattern disposed outside the sealing member, the first substrate may include a first inflection point where the first inclined surface meets the upper surface of the first substrate, the second substrate may include a second inflection point where the second inclined surface meets the lower surface of the second substrate, and the dummy pattern may be disposed in a space between the sealing member and an inflection reference line that is a straight line connecting the first inflection point to the second inflection point.

An outer surface of the dummy pattern may include a first inclined region extending from the first inclined surface, and a second inclined region extending from the second inclined surface.

The first inclined surface may have a first curvature, the second inclined surface may have a second curvature, the outer surface of the dummy pattern may include a first concave region extending from the first inclined surface and having the first curvature, and the outer surface of the dummy pattern may include a second concave region extending from the second inclined surface and having the second curvature.

The first curvature may be equal to the second curvature.

The display device may further include a line disposed on the first substrate, the line including an end aligned with the first inflection point.

The display device may further include a conductive pattern disposed on the first substrate and the second substrate along the first side surface, the first inclined surface, the second inclined surface, and the second side surface.

Still another aspect of the disclosure provides a method of manufacturing a display device, which may include polishing a side surface of a first substrate and a side surface of a second substrate to be arranged in a first direction perpendicular to an upper surface of the first substrate and an upper surface of the second substrate, wherein the first substrate may include a connection line, and the second substrate faces the first substrate, and polishing the side surface of the first substrate and the side surface of the second substrate in a second direction perpendicular to the first direction to form a recessed portion.

The method may further include forming a connection pad along a morphology of the recessed portion.

The forming of the connection pad along the morphology of the recessed portion may include forming a connection pad layer by a plating or sputtering method, and patterning the connection pad layer and forming the connection line including a first portion contacting the side surfaces of the first substrate and the second substrate, and a second portion disposed in each of the first substrate and the second substrate and contacting the connection line.

The connection line may include one of aluminum (Al) or silver (Ag).

An end of the connection line may be disposed in each of the first substrate and the second substrate which are arranged in the first direction.

Each of the first substrate and the second substrate may include glass, and the recessed portion may include a first region exposing a surface of the glass of the first substrate and a second region exposing a surface of the glass of the second substrate.

The recessed portion may include a third region disposed between the first region and the second region and exposing the end of the connection line which is disposed in each of the first substrate and the second substrate.

The recessed portion may include a dummy pattern disposed between the first substrate and the second substrate, and a fourth region disposed between the first region and the third region and exposing the dummy pattern.

The second portion of the connection pad may contact the surface of the glass of each of the first substrate and the second substrate.

The second portion of the connection pad may contact the end of the connection line and the dummy pattern.

In accordance with the disclosure, in a display device, a bezel area may be effectively reduced, and a connection line and a line layer may be prevented from being open.

The effects according to the embodiments are not limited by the contents discussed above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
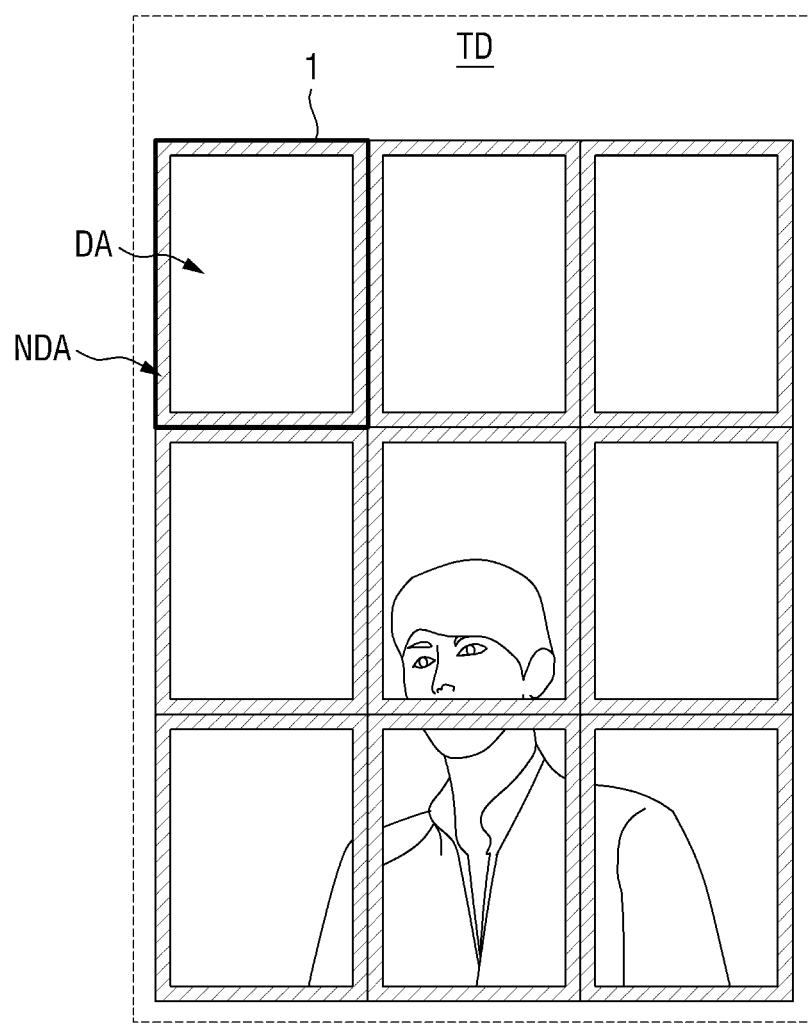
FIG. 1 is a schematic diagram illustrating a tile-type display device.

Advantages and features of the disclosure and methods for achieving them will be made clear from embodiments described in detail below with reference to the accompanying drawings. The disclosure may, however, be implemented in many different forms and should not be construed as being limited to the embodiments set forth herein, and the embodiments are provided such that this disclosure will be thorough and complete and will fully convey the scope of the disclosure to those skilled in the art to which the disclosure pertains, and the disclosure is defined only by the scope of the appended claims.

When elements or layers are referred to as being "on" another element or layer, this may include all cases of being directly on another element or layer or being on another element or layer with still another element or layer interposed therebetween. The same reference numerals refer to the same components throughout this disclosure.

Although the terms first, second, and the like are used to describe various components, these components are substantially not limited by these terms. These terms are used only to distinguish one component from another component.

Therefore, a first component described below may substantially be a second component within the technical spirit of the disclosure.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
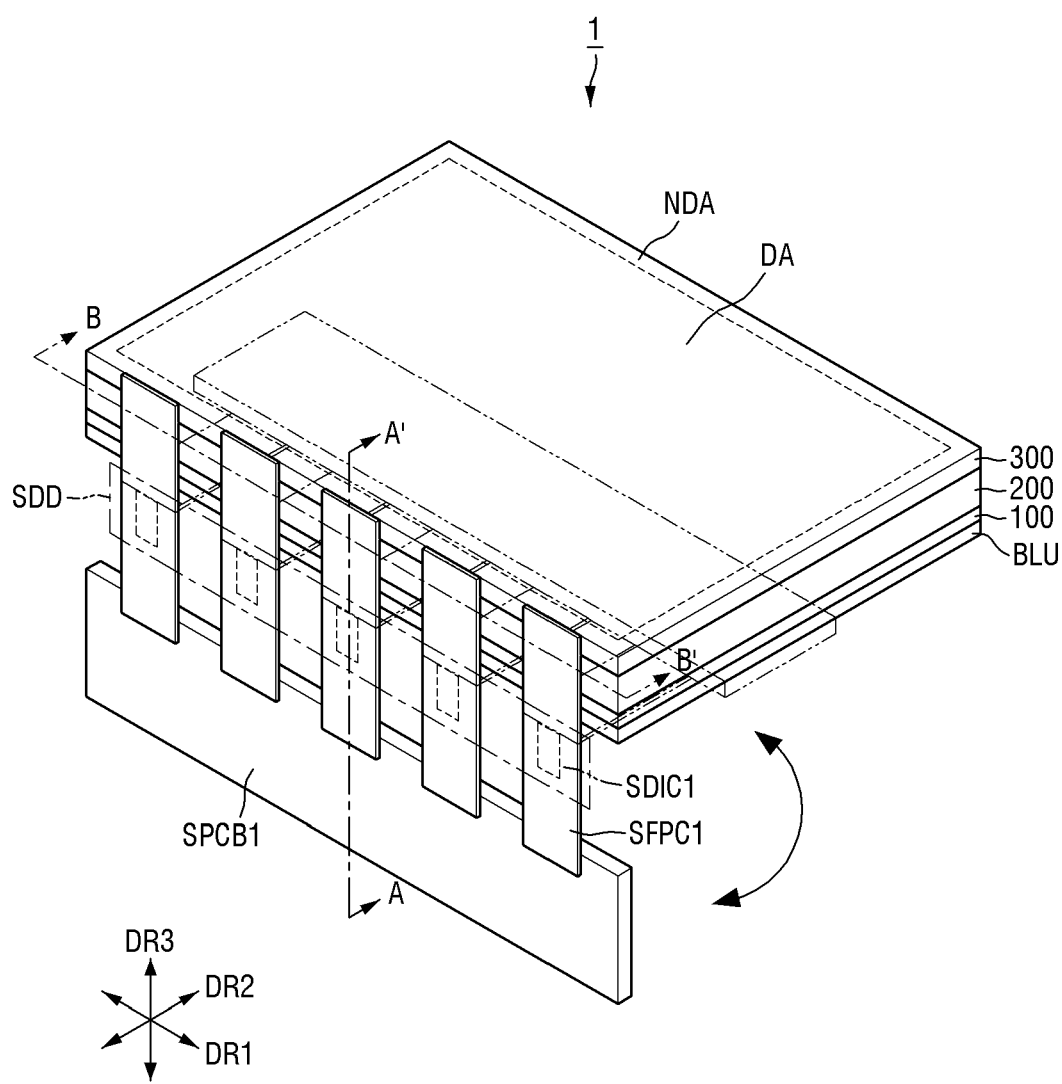
FIG. 2 is a schematic perspective view illustrating a display device according to one embodiment.
Figure 3:
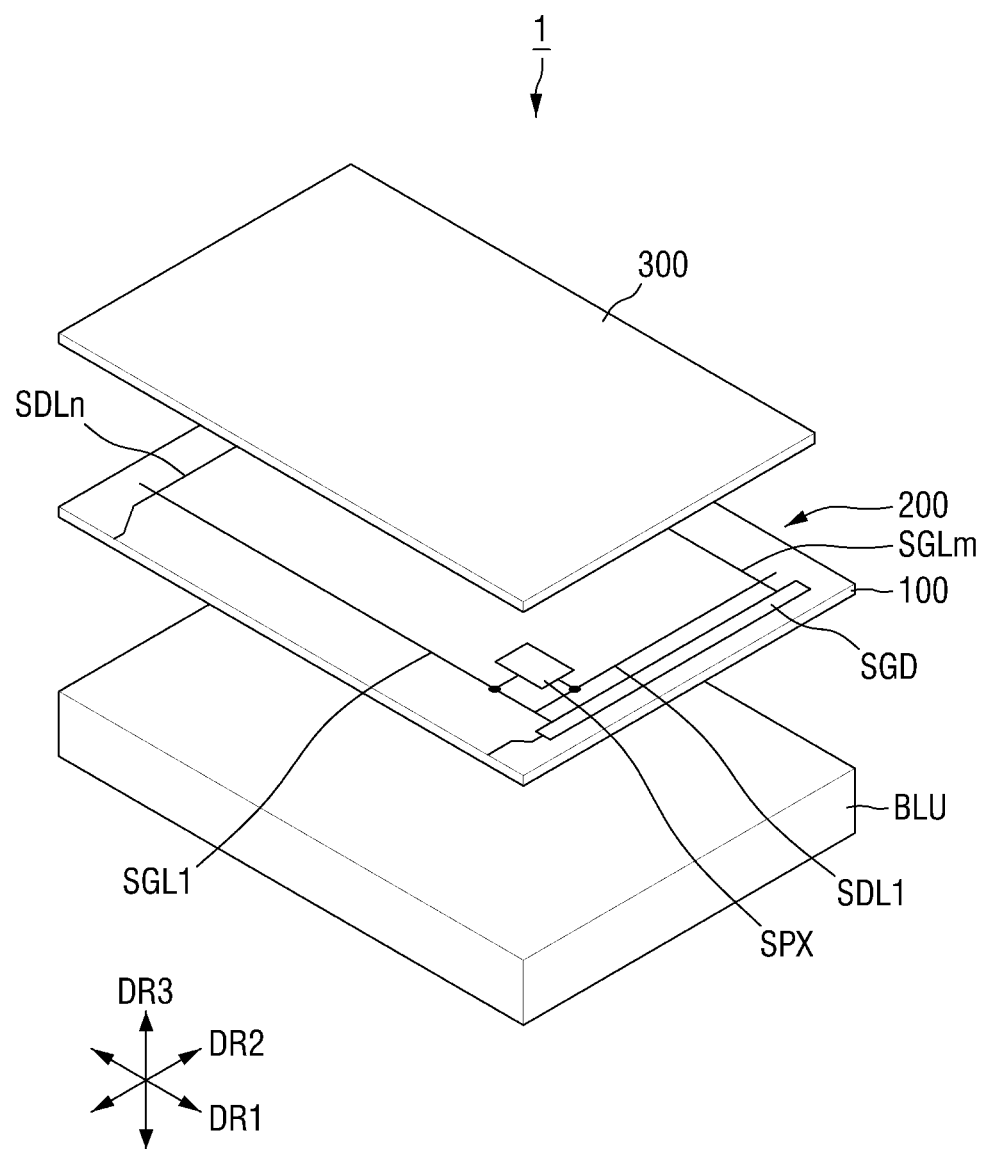
FIG. 3 is a schematic exploded perspective view illustrating some parts of the display device of FIG. 2 which are disassembled.
Figure 4:
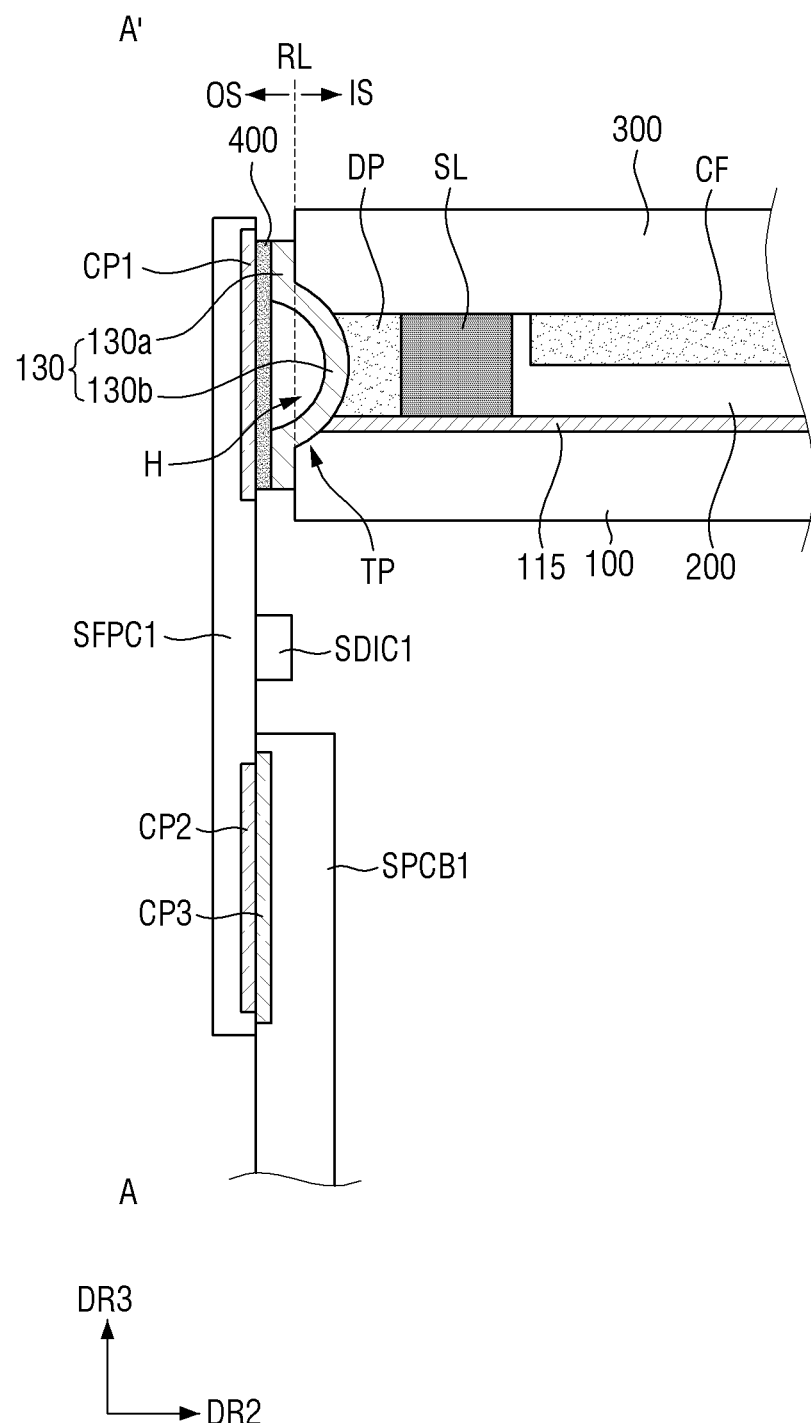
FIG. 4 is a schematic cross-sectional view taken along line A-A' of FIG. 2.
Figure 5:
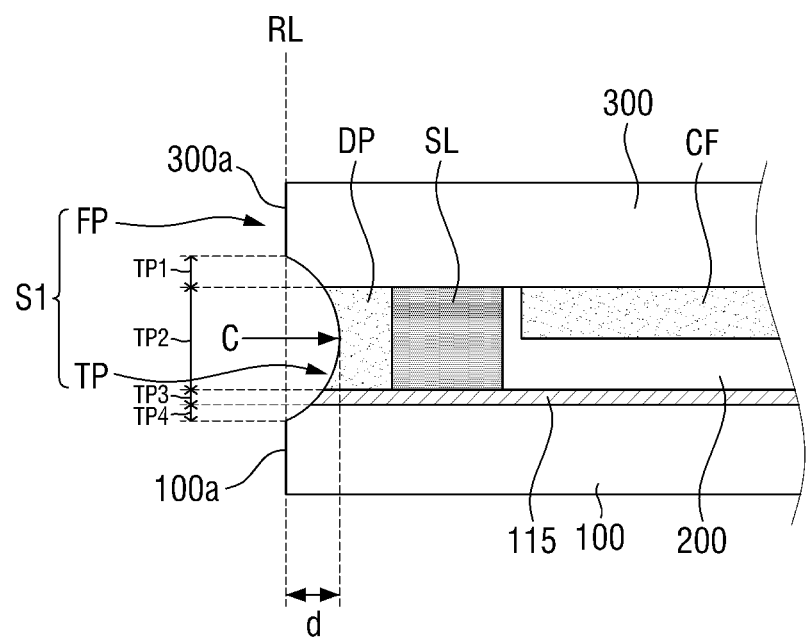
FIG. 5 is a schematic cross-sectional view illustrating a portion of FIG. 4 to describe a recessed portion.

Hereinafter, embodiments of the disclosure will be described with reference to the accompanying drawings. FIG. 1 is a schematic diagram illustrating a tile-type display device, FIG. 2 is a schematic perspective view illustrating a display device according to an embodiment, FIG. 3 is a schematic exploded perspective view illustrating some parts of the display device of FIG. 1 which are disassembled, FIG. 4 is a schematic cross-sectional view taken along line A-A' of FIG. 2, and FIG. 5 is a schematic cross-sectional view illustrating a portion of FIG. 4 to describe a recessed portion.

Hereinafter, the embodiments in which a display device is a liquid crystal display device including a liquid crystal layer will be described, but the disclosure is not limited thereto. For example, in case that a display device (e.g., an organic light-emitting diode display device) different from a liquid crystal display device is employed, some components, which will be described below, may be omitted, or other components not described here may be added.

The display device according to the embodiments may be applied to large electronic equipment such as televisions or external advertising boards and small- and medium-sized electronic equipment such as personal computers (PCs), laptop computers, vehicle navigation systems, and cameras. The display device may be applied to tablet PCs, smartphones, personal digital assistants (PDAs), portable multimedia players (PMPs), game consoles, and wristwatch-type electronic devices. The above electronic devices are merely illustrative, and other electronic devices may also be employed.

Referring to FIG. 1, a tile-type display TD may include display devices 1. In an embodiment, the display devices 1 may be arranged in a grid shape, but the disclosure is not limited thereto. For example, the display devices 1 may be arranged to be connected in a first direction, connected in a second direction, and connected to have a specific shape. The display devices may have the same size, but the disclosure is not limited thereto, and the display devices 1 may be different sizes.

In an embodiment, each of the display devices 1 included in the tile-type display TD may have a rectangular shape including a long side and a short side. The display devices 1 may be disposed such that the long sides or short sides are connected to each other. Some of the display devices 1 may form a side of the tile-type display TD, and some of the display devices 1 may be located at a corner of the tile-type display TD to form two adjacent sides of the tile-type display TD, and some of the display devices 1 may form a structure in which some display devices 1 are located inside the tile-type display TD to be surrounded by other display devices 1. The display devices 1 may have different bezel shapes according to their positions and may have the same bezel shape.

The tile-type display TD may be a flat display device 1, but the disclosure is not limited thereto, and the tile-type display TD may have a three-dimensional shape so as to provide a three-dimensional effect. In case that the tile-type display TD has a three-dimensional shape, each of the display devices 1 included in the tile-type display TD may have a curved shape and may be connected with each other in a flat shape or at a predetermined angle to three-dimensionally form an entire shape of the tile-type display TD.

Bezels of the display devices 1 may be connected to each other or connected through a connection member (not shown). As described above, since the display devices 1 are connected in the tile type display TD, bezel areas of the display devices 1 may be disposed to overlap in a connection portion so that each of the display devices 1 has a thin bezel, and to this end, each of the display devices 1 may be equipped with a side connection pad. Detailed descriptions thereof will be described below.

Hereinafter, embodiments of the display device 1, which is applicable to display devices 1 of the tile type display TD or is applicable to a single display device 1, will be described in detail.

Referring to FIGS. 2 to 5, each of the display devices 1 may include a first substrate 100, a liquid crystal layer 200, and a second substrate 300. In an embodiment, the display device 1 may further include a flexible printed circuit board SFPC1, a driving printed circuit board SPCB1, and a backlight unit BLU.

For example, each of the first substrate 100, the second substrate 300, and the backlight unit BLU may have a rectangular shape having long sides in a first direction DR1 and short sides in a second direction DR2 intersecting the first direction DR1. However, the shapes of the first substrate 100, the second substrate 300, and the backlight unit BLU are not limited thereto, and each of the first substrate 100, the second substrate 300, and the backlight unit BLU may have a curved portion in some regions, as desired.

The backlight unit BLU may generate light and provide the generated light to the first substrate 100, the liquid crystal layer 200, and the second substrate 300. A display panel including the first substrate 100, the liquid crystal layer 200, and the second substrate 300 may generate an image by using the light provided from the backlight unit BLU and may provide the image to the outside.

The display panel may include a display area DA in which an image is displayed and a non-display area NDA in which an image is not displayed. For example, the non-display area NDA may be an area surrounding the display area DA. Although not shown in the drawings, the display device 1 may further include a window member, which covers and overlaps the display panel and transmits an image to the outside, on the second substrate 300.

For example, the backlight unit BLU may be an edge-type backlight unit or a direct type backlight unit, but the embodiments are not limited thereto.

The first substrate 100 may include pixels SPX. In an embodiment, the pixels SPX may be arranged in the form of a matrix, but the disclosure is not limited thereto. Gate lines SGL1 to SGLm (where m is a natural number) and data lines SDL1 to SDLn (where n is a natural number) may be disposed along boundaries of the pixels SPX. Here, the gate lines SGL1 to SGLm may function as selection lines for selecting the pixels SPX.

For convenience of description, although only a pixel SPX has been illustrated in FIG. 3, the pixels SPX may be substantially defined on the first substrate 100. A pixel electrode defining a pixel may be disposed on each of the pixels SPX.

The gate lines SGL1 to SGLm and the data lines SDL1 to SDLn may be disposed to intersect each other and may be insulated from each other. The gate lines SGL1 to SGLm may extend in the first direction DR1 to be electrically connected to a gate driver SGD. The data lines SDL1 to SDLn may extend in the second direction DR2 to be electrically connected to a data driver SDD.

The pixels SPX may be disposed to be electrically connected to the gate lines SGL1 to SGLm and the data lines SDL1 to SDLn which intersect each other. For example, the pixels SPX may be disposed in the form of a matrix, but the embodiments are not limited thereto.

For example, the gate driver SGD may be disposed in a predetermined area adjacent to at least one of the short sides of the first substrate 100. However, an arrangement of the gate driver SGD is not limited thereto.

For example, the gate driver SGD may be simultaneously formed in a process of manufacturing transistors which drive the pixels SPX and may be mounted on the first substrate 100 in the form of an amorphous silicon thin film transistor (TFT) gate driver circuit (ASG) or an oxide silicon TFT gate driver circuit (OSG).

However, the embodiments are not limited thereto, and the gate driver SGD may be formed as driving chips, mounted on a flexible driving circuit board, and connected to the first substrate 100 in a tape carrier package (TCP) method. The gate driver SGD may be formed as driving chips and mounted on the first substrate 100 in a chip-on-glass (COG) method.

The data driver SDD may include a source driving chip SDIC1. The data driver SDD may include a source driving chip SDIC1 or source driving chips SDIC1. In the embodiment shown in the drawings, an example in which five source driving chips SDIC1 are disposed will be described, but it is obvious that the number of the source driving chips SDIC1 is not limited.

For example, the driving printed circuit board SPCB1 may include a timing controller (not shown). The timing controller may be mounted on the driving printed circuit board SPCB1 in the form of an integrated circuit (IC) chip and electrically connected to the gate driver SGD and the data driver SDD. The timing controller may output a gate control signal, a data control signal, and pieces of image data.

The gate driver SGD may receive a gate control signal from the timing controller. In response to a gate control signal, the gate driver SGD may generate gate signals and sequentially output the generated gate signals. The gate signals may be provided to the pixels PX through the gate lines SGL1 to SGLm in row units. Consequently, the pixels SPX may be driven in row units.

The data driver SDD may receive pieces of image data and a data control signal from the timing controller. In response to the data control signal, the data driver SDD may generate and output data voltages, in the form of an analog, corresponding to the pieces of image data. The data voltages may be provided to the pixels SPX through the data lines SDL1 to SDLn.

In response to the gate signals provided through the gate lines SGL1 to SGLm, the pixels SPX may receive the data voltages through the data lines SDL1 to SDLn. The pixels SPX may display gray scales corresponding to the data voltages to control the transmittance of an area in which each of the pixels SPX is disposed.

Although the flexible printed circuit boards SFPC1 have been illustrated as being connected adjacent to the long sides of the first and second substrates 100 and 300 in the drawings, the embodiments are not limited thereto. A position where the first and second substrates 100 and 300 and the flexible printed circuit board SFPC1 are connected to each other may be changed as desired. For example, the flexible printed circuit boards SFPC1 may be disposed adjacent to the short sides of the first and second substrates 100 and 300. The flexible printed circuit boards SFPC1 may be disposed on the long sides of the first and second substrates 100 and 300. The flexible printed circuit boards SFPC1 may be disposed on the short sides of the first and second substrates 100 and 300 or may have a structure of being disposed on the long sides and short sides.

The flexible printed circuit boards SFPC1 may include contact pads CP1. The source driving chips SDIC1 may be electrically connected to the contact pads CP1 of the flexible printed circuit boards SFPC1. The contact pads CP1 of the flexible printed circuit boards SFPC1 may be electrically connected to connection pads 130 disposed on side surfaces of the first and second substrates 100 and 300 through adhesive films 400.

The connection pads 130 may be bonded or attached to the flexible printed circuit boards SFPC1 through the adhesive films 400. For example, the connection pads 130 may be electrically connected to the contact pads CP1 of the flexible printed circuit boards SFPC1 by an outer lead bonding (OLB) method using the adhesive films 400.

In an embodiment, the adhesive film 400 may be disposed to entirely cover or overlap the connection pad 130, but the disclosure is not limited thereto, and the adhesive film 400 may be disposed to expose a portion of the connection pad 130.

In some embodiments, the adhesive film 400 may include an anisotropic conductive film (ACF). In case that the adhesive film 400 is an anisotropic conductive film, the adhesive film 400 may have conductivity only in an area where the connection pad 130 and the contact pad CP1 of the flexible printed circuit board SFPC1 contact each other so that the connection pad 130 may be electrically connected to the contact pad CP1 of the flexible printed circuit board SFPC1. In another embodiment, the connection pads 130 and the contact pads CP1 may directly contact each other without the adhesive films 400 to be electrically connected. For example, the connection pads 130 and the contact pads CP1 may be directly connected by an ultrasonic bonding method or a welding method.

As shown in FIG. 4, the connection pads 130 may be electrically connected to connection lines 115 disposed on the first substrate 100. As described below, the connection lines 115 may extend from the side surface of the first substrate 100 toward an inside thereof (e.g., extend in the second direction DR2) to be electrically connected to the pixels SPX.

At least one side surface S1 of the display device 1 on which the connection pads 130 are disposed may include a flat portion FP and a recessed portion TP. In an embodiment, a structure in which the recessed portion TP is disposed on a side surface adjacent to the long side of the display device 1 is illustrated, but the disclosure is not limited thereto, and the recessed portion TP may be disposed on a side surface adjacent to the short side of the display device 1. The recessed portion TP may be disposed on each side surface adjacent to the long side of the display device 1. As another example, the recessed portion TP may have a structure of being disposed on each side surface adjacent to the short side of the display device 1 or have a structure of being disposed on a side surface adjacent to the long side and a side surface adjacent to the short side. The flat portion FP may function as a buffer to prevent damage to side portions of the second substrate 300 and the first substrate 100 on which the recessed portion TP is disposed because of an external impact.

In FIGS. 4 and 5, the recessed portion TP may be formed in a direction from the flat portion FP of the side surface S1 of the display device 1 toward a central portion of the display device 1, for example, in the second direction DR2. In an embodiment, outer surfaces 100a and 300a maximally protruding from the first substrate 100 and the second substrate 300 may be arranged in the third direction DR3 in a plan view. Here, a line connecting the outer surface 100a of the first substrate 100 and the outer surface 300a of the second substrate 300 in the third direction DR3 is defined as a reference line RL.

The recessed portion TP may have a form in which portions of the first substrate 100, the connection line 115, a dummy pattern DP, and the second substrate 300 are polished. For example, the recessed portion TP may have a semicircular shape disposed over the first substrate 100, the connection line 115, the dummy pattern DP, and the second substrate 300 based on a cross section taken along line A-A'. However, the disclosure is not limited thereto, and the recessed portion TP may be disposed over some components among the first substrate 100, the connection line 115, the dummy pattern DP, and the second substrate 300. For example, the recessed portion TP may be a form in which some portions of the first substrate 100, the connection line 115, and the dummy pattern DP are polished or may be a form in which some portions of the second substrate 300, the dummy pattern DP, and the connection line 115 are polished.

Owing to the recessed portion TP, some portions of one side surface of the first substrate 100 and the second substrate 300 form constantly curved surfaces to expose bare glass, and an end of the connection line 115 is exposed inside the reference line RL. The end of the connection line 115 may have an inclined cross section due to the recessed portion TP.

The recessed portion TP may be disposed in a corner region where a side surface and an upper surface (a surface facing the second substrate 300) of the first substrate 100 meet each other. For example, a recessed portion TP formed as an inclined surface may be disposed on a side surface and an upper surface of the corner region, and the inclined surface may include a curved part and/or a straight part. The recessed portion TP may be disposed in a corner region where a side surface and a lower surface (a surface facing the first substrate 100) of the second substrate 300 meet each other. For example, a recessed portion TP formed as an inclined surface may be disposed on a side surface and a lower surface of a corner region, and the inclined surface may include a straight part and/or a curved part. In case that the inclined surface formed on the first substrate 100 and the inclined surface formed on the second substrate 300 are curved surfaces, the curved surfaces may have the same curvature, but the disclosure is not limited thereto, and the curved surfaces may have different curvatures.

A depth d of the recessed portion TP may be increased in a direction toward a central portion of the recessed portion TP. The central portion C of the recessed portion TP may be located between the first substrate 100 and the second substrate 300. For example, the first substrate 100 and the second substrate 300 may be symmetrical with respect to the central portion C of the recessed portion TP. However, the disclosure is not limited thereto, and the central portion C of the recessed portion TP may be biased toward either the first substrate 100 or the second substrate 300.

To describe a shape of the recessed portion TP in detail, the recessed portion TP may include first to fourth regions TP1, TP2, TP3, and TP4. For example, the recessed portion TP may include the first region TP1 exposing the bare glass of the second substrate 300, the second region TP2 disposed between the first substrate 100 and the second substrate 300, the third region TP3 exposing the end of the connection line 115, and the fourth region TP4 exposing the bare glass of the first substrate 100. Here, the component exposed by the second region TP2 of the recessed portion TP may vary according to a component disposed at an edge between the first substrate 100 and the second substrate 300. In an embodiment, since the dummy pattern DP is disposed, the dummy pattern DP may be exposed by the second region TP2 of the recessed portion TP, and the recessed portion TP and a sealant SL may be disposed to be spaced apart from each other. However, in case that the dummy pattern DP is omitted, the sealant SL may be exposed by the recessed portion TP.

The connection pad 130 may be disposed to cover or overlap the recessed portion TP. For example, the connection pad 130 may include a first portion 130a disposed in the flat portion FP of the side surface S1 of the display device 1, and a second portion 130b disposed in the recessed portion TP. The first portion 130a may be disposed on an outer side OS of the reference line RL, and the second portion 130b may be disposed on an inner side IS of the reference line RL, but the disclosure is not limited thereto, and shapes of the first portion 130a and the second portion 130b may be variously modified according to a material forming the connection pad 130 and a manufacturing process thereof. More specifically, the second portion 130b of the connection pad 130 may have a curved shape corresponding to the shape of the recessed portion TP. For example, the second portion 130b may directly contact the bare glass of the second substrate 300 exposed by the first region TP1 of the recessed portion TP, a side surface of the dummy pattern DP exposed by the second region TP2 of the recessed portion TP between the first substrate 100 and the second substrate 300, the end of the connection line 115 exposed by the third region TP3 of the recessed portion TP, and the bare glass of the first substrate 100 exposed by the fourth region TP4 of recessed portion TP and may be disposed along the morphology of the recessed portion TP.

The second portion 130b of the connection pad 130 may be electrically connected to the end of connection line 115 which is exposed by the third region TP3 of the recessed portion TP at the inner side IS of the reference line RL. The connection pad 130 may be made of aluminum (Al) or silver (Ag), but the disclosure is not limited thereto.

The adhesive film 400 may be disposed outside the connection pad 130. The adhesive film 400 may electrically connect the connection pad 130 to the contact pad CP1 of the flexible printed circuit board SFPC1. Since the connection pad 130 is disposed along the morphology of the recessed portion TP, a void H may be formed between the connection pad 130 and the adhesive film 400 to correspond to the recessed portion TP. However, the disclosure is not limited thereto, and the adhesive film 400 may be disposed along the morphology of the connection pad 130.

In another embodiment, the connection pads 130 and the contact pad CP1 may directly contact each other without the adhesive film 400 and be electrically connected to each other. For example, the connection pads 130 and the contact pad CP1 may be directly connected by an ultrasonic bonding method or a welding method.

As described above, since the recessed portion TP is disposed on at least one side surface S1 of the display device 1 so that the connection line 115 and the connection pad 130 may contact each other at the inner side IS of the reference line RL, in a polishing process in which the first substrate 100 and the second substrate 300 are coplanarly arranged, it is possible to effectively prevent the connection line 115 from being damaged and to effectively prevent the connection line 115 and the connection pads 130 from being open because of foreign materials that are generated and accumulated on the connection line 115 during the polishing process.

A color filter layer CF and the sealant SL may be disposed between the first substrate 100 and the second substrate 300. The color filter layer CF may increase quality of an image output from the display device 1, and the sealant SL may be disposed along the edges of the first and second substrates 100 and 300 outside the color filter layer CF to prevent leakage of the liquid crystal layer 200 filling between the first and second substrates 100 and 300. In an embodiment, the sealant SL and the recessed portion TP may be spaced apart from each other, but the disclosure is not limited thereto.

The dummy pattern DP may be disposed in a region adjacent to the connection pads 130 between the first substrate 100 and the second substrate 300. In an embodiment, the dummy pattern DP may be fixed to the second substrate 300, and an end portion of the dummy pattern DP may face the first substrate 100. The end portion of the dummy pattern DP may contact a structure on the first substrate 100. For example, the end portion of the dummy pattern DP may contact the connection line 115. In a plan view, the dummy pattern DP may be disposed between the side surfaces of the first substrate 100 and the second substrate 300 and may be connected to and aligned with the first and second substrate 100 and 300, but the disclosure is not limited thereto, and the dummy pattern DP may be disposed in an island shape to correspond to an area in which the connection pad 130 is disposed. As another example, the dummy pattern DP may be disposed on four side surfaces in the form of surrounding the edges of the first substrate 100 and the second substrate 300.

The dummy pattern DP may include a first inflection point where the second region TP2 and the third region TP3 of the recessed portion TP meet each other and a second inflection point where the first region TP1 and the third region TP3 of the recessed portion TP meet each other, and the dummy pattern DP may be disposed between the sealant SL and an inflection reference line that is a straight line connecting the first and second inflection points. The dummy pattern DP may be formed by depositing an identical material to the color filter layer CF. The disclosure is not limited thereto, and the dummy pattern DP may be omitted, a column spacer may be disposed in place of the dummy pattern DP, or a width of the sealant SL may be increased to replace the dummy pattern DP.

The driving printed circuit board SPCB1 may be electrically connected to the flexible printed circuit boards SFPC1. Specifically, a contact pad CP2 of the flexible printed circuit board SFPC1 may be electrically connected to a contact pad CP3 of the driving printed circuit board SPCB1 so that the flexible printed circuit board SFPC1 may be electrically connected to the driving printed circuit board SPCB1.

Thus, the source driving chips SDIC1 may also be electrically connected to the driving printed circuit board SPCB1.

In some embodiments, the flexible printed circuit board SFPC1 may be provided in the form of a flexible printed circuit board. Specifically, the flexible printed circuit board SFPC1 may be formed as a chip-on-film (COF) type board. Therefore, the data driver SDD may be connected to the first and second substrates 100 and 300 and the driving printed circuit board SPCB1 by a TCP method. As shown in FIG. 2 as a dotted line, the flexible printed circuit boards SFPC1 may be bent to a rear surface of the backlight unit BLU so that the driving printed circuit board SPCB1 may be located on the rear surface of the backlight unit BLU. In this case, the source driving chips SDIC1 may be disposed between the backlight unit BLU and the flexible printed circuit board SFPC1, but the disclosure is not limited thereto, and the source driving chips SDIC1 may be disposed on a surface opposite to a surface of the flexible printed circuit board SFPC1 facing the backlight unit BLU.

The second substrate 300 may be disposed above the first substrate 100. Specifically, the second substrate 300 may be disposed to be spaced apart from the first substrate 100 in the third direction DR3. The liquid crystal layer 200 may be disposed between the second substrate 300 and the first substrate 100. In an embodiment, a common electrode for applying an electric field to the liquid crystal layer 200 may be disposed on the second substrate 300 together with the pixel electrode of the first substrate 100, but the disclosure is not limited thereto, and the pixel electrode and the common electrode may be disposed on the first substrate 100.

Although not shown in the drawings, an optical sheet (not shown) including a polarizing sheet may be disposed between the backlight unit BLU and the first substrate 100. The optical sheet may control a characteristic of light provided from the backlight unit BLU to allow transmittance of light passing through the display panel to be smoothly controlled. Although not shown in the drawings, the display device 1 may further include an accommodation member (not shown) capable of accommodating the backlight unit BLU and the display panel.

Figure 6:
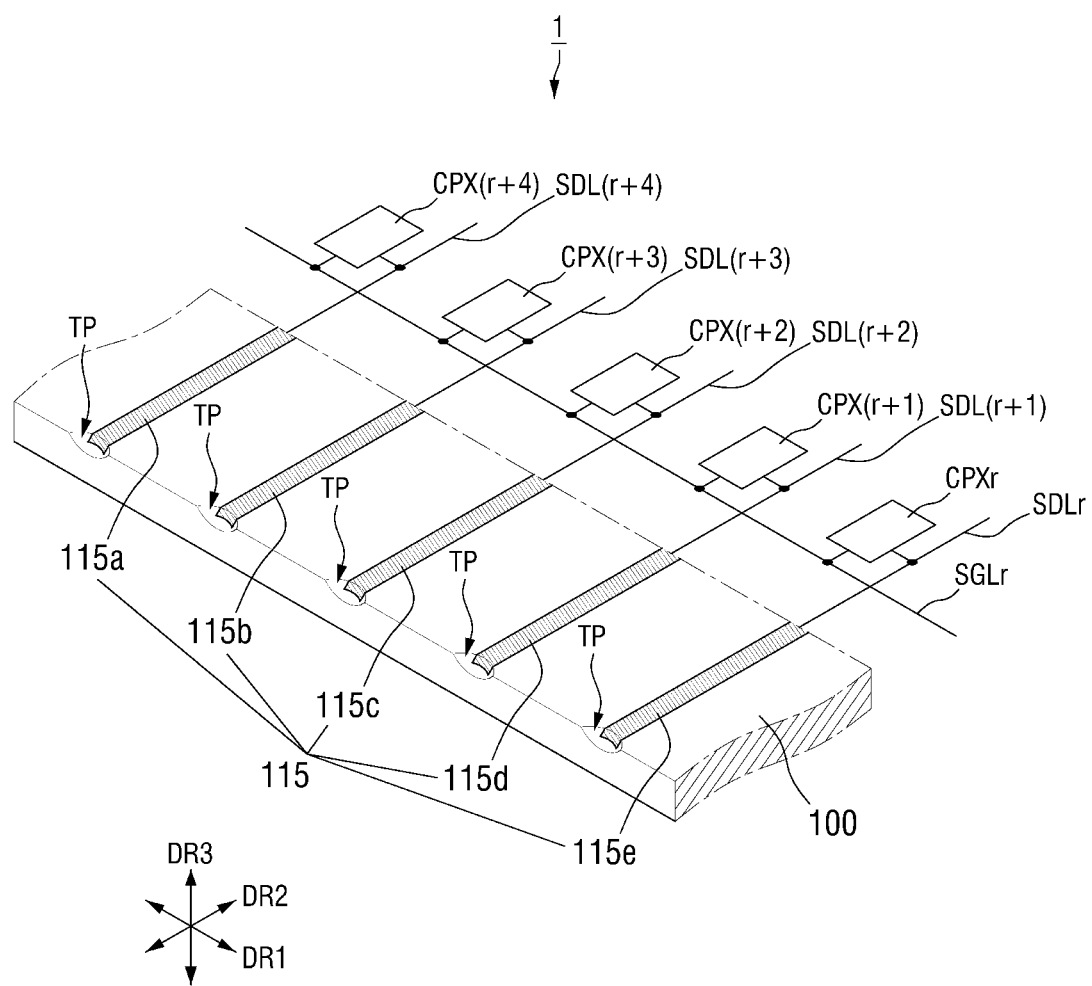
FIG. 6 is a schematic diagram illustrating connection lines and connection pads of a first substrate.

FIG. 6 is a schematic diagram illustrating the connection lines and the connection pads of the first substrate. The connection lines and the connection pads will be described in more detail with reference to FIG. 6 together with FIG. 4.

Referring to FIGS. 4 and 6, the connection pad 130 for an electrical connection with the flexible printed circuit board SFPC1 may be disposed on the side surfaces of the first substrate 100 and the second substrate 300. As described above, in the display device 1 according to the embodiment, the connection pad 130 is disposed on at least one side surface S1 of the display device 1 so that the non-display area NDA may be minimized. The recessed portion TP may be disposed on at least one side surface S1 of the display device 1, and thus the connection lines 115 and the connection pads 130 may contact each other at the inner side IS of the reference line RL so that it is possible to effectively prevent an opening (or disconnection) between connection lines 115 and connection pads 130.

For example, the connection pad 130 may include silver (Ag), but a material of the connection pad 130 is not limited thereto.

As shown in the drawing, connection lines 115a to 115e may be electrically connected to data lines SDLr to SDL(r+

4) (where r is a natural number). Therefore, the connection pad 130 may also be electrically connected to the data lines SDLr to SDL(r+4).

A gate line SGLr may be disposed to intersect the data lines SDLr to SDL(r+4). Pixels CPXr to CPX(r+4) may be electrically connected to the gate line SGLr.

Although only five connection lines 115a to 115e have been illustrated in the drawing, this is for convenience of description, and the actual number of the connection lines 115a to 115e electrically connected to the data lines SDLr to SDL(r+4) may be more or less than five.

The data lines SDLr to SDL(r+4) may be electrically connected to the pixels CPXr to CPX(r+4), respectively. Therefore, the connection lines 115a to 115e may be electrically connected to the pixels CPXr to CPX(r+4), respectively. Each of the connection pads 130 may also be electrically connected to one of the pixel CPXr to CPX(r+4).

For example, each of the connection lines 115a to 115e may include copper (Cu), but a material of each of the connection lines 115a to 115e is not limited thereto.

Referring to FIG. 6 together with FIG. 2, the source driving chips SDIC1 mounted on the flexible printed circuit boards SFPC1 may generate data voltages for driving the pixels CPXr to CPX(r+4) electrically connected through the connection pads 130. The generated data voltages may be transferred to the data lines SDLr to SDL(r+4) through the connection pads 130.

As described above, although only an example in which the connection lines 115 are electrically connected to the data lines SDLr to SDL(r+4) has been described, embodiments according to the technical idea of the disclosure are not limited thereto. According to the technical idea of the disclosure, the connection lines 115 and the connection pads 130 may be disposed in a similar form and be modified to be implemented to be electrically connected to the gate lines SGL1 to SGLm of FIG. 2 or to other lines of the first substrate 100.

Figure 7:
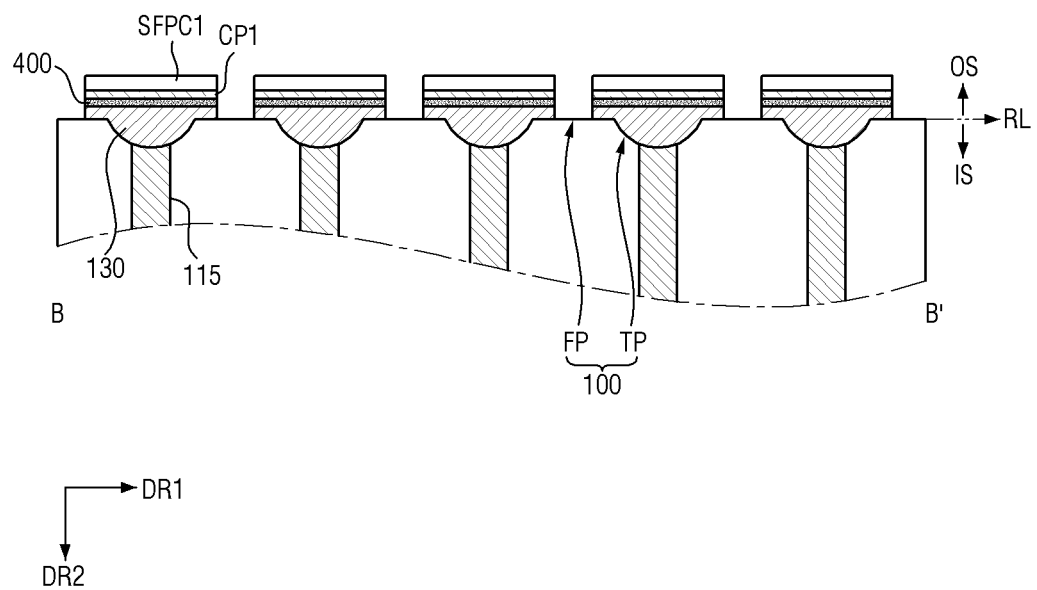
FIG. 7 is a schematic cross-sectional view taken along line B-B' of FIG. 2 according to one embodiment.
Figure 8:
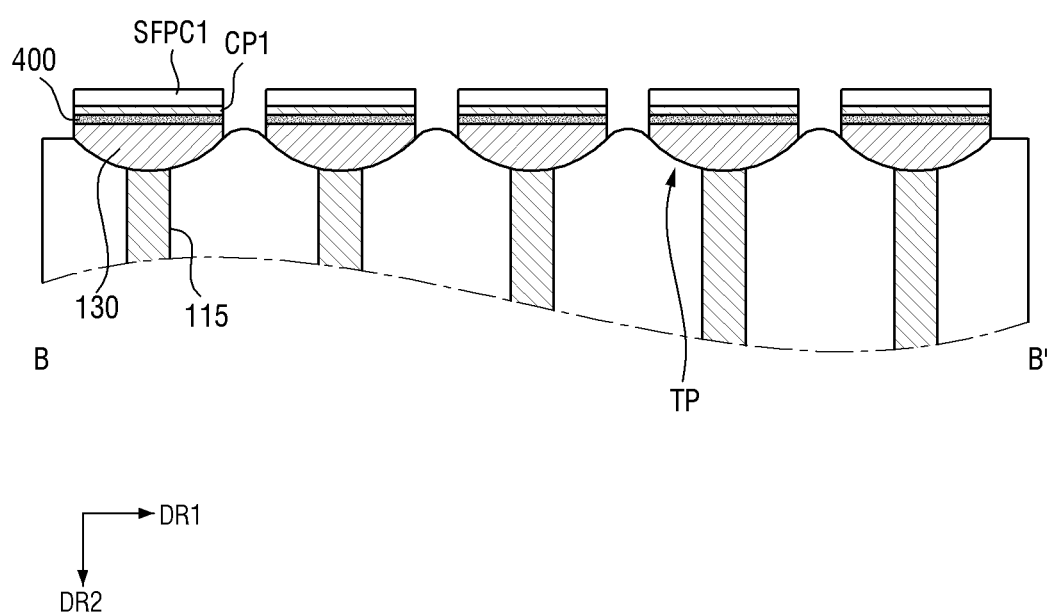
FIG. 8 is a schematic cross-sectional view taken along line B-B' of FIG. 2 according to another embodiment.
Figure 9:
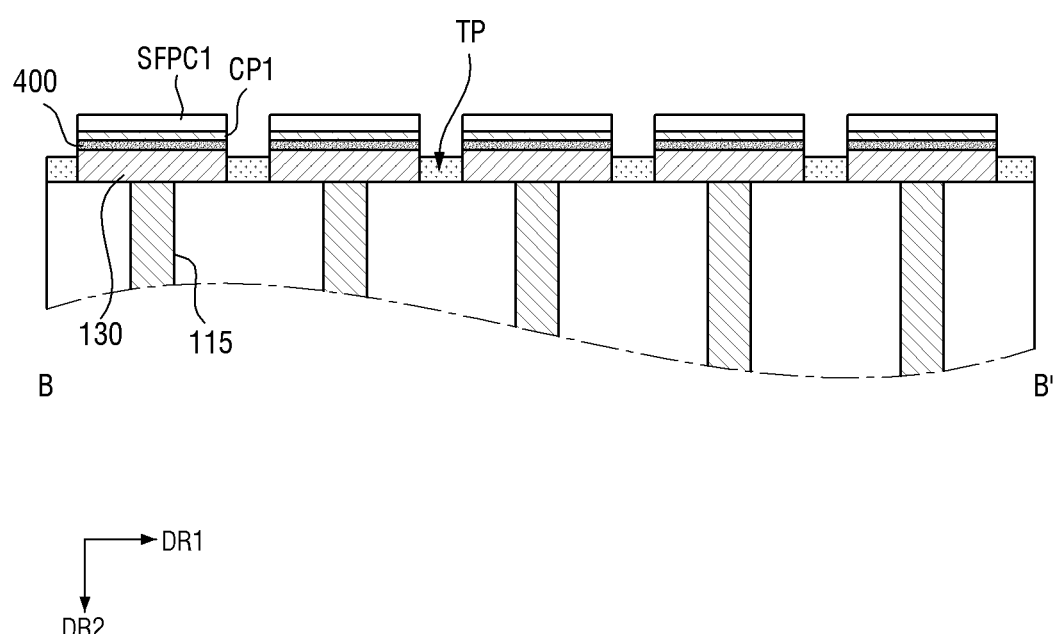
FIG. 9 is a schematic cross-sectional view taken along line B-B' of FIG. 2 according to still another embodiment.

FIG. 7 is a schematic cross-sectional view taken along line B-B' of FIG. 2 according to an embodiment, FIG. 8 is a schematic cross-sectional view taken along line B-B' of FIG. 2 according to another embodiment, and FIG. 9 is a schematic cross-sectional view taken along line B-B' of FIG. 2 according to still another embodiment.

Referring to FIG. 7, in an embodiment, at least one side surface S1 of a display device 1 may include flat portions FP and recessed portions TP. A cross section of each of the recessed portions TP taken along line B-B' may have a round shape, and the recessed portions TP may be disposed to be spaced apart from each other in the first direction DR1. For example, the flat portions FP and the recessed portions TP may be alternately disposed in the first direction DR1, ends of connection lines 115 may be exposed by the recessed portions TP, and connection pads 130 may contact the ends of the connection lines 115 of the recessed portions TP.

Referring to FIG. 8, in another embodiment, recessed portions TP may be disposed to be connected to each other in the first direction DR1. For example, the recessed portions TP may be disposed to be connected to each other without the flat portions FP, and radius curvatures thereof may be different from the radius curvatures of the recessed portions TP shown in FIG. 7.

Referring to FIG. 9, in still another embodiment, recessed portions TP may be disposed in the form of a bar in the first direction DR1. For example, the recessed portions TP may be disposed in the form of a bar in the first direction DR1, ends of connection lines 115 may be separated and exposed by the recessed portions TP, and connection pads 130 may be respectively connected to the ends of the connection lines 115 to correspond thereto.

As described with reference to FIGS. 7 to 9, the recessed portions TP may be disposed to correspond to the connection lines 115, but the disposed is not limited thereto. A recessed portion TP may be disposed to correspond to a group of connection lines 115.

In an embodiment, the connection pads 130 may be disposed to correspond to the recessed portions TP. However, the disposed is not limited thereto, and connection pads 130 may be disposed to correspond to a recessed portion TP. For example, in case that a recessed portion TP is disposed to correspond to a group of connection lines 115, the connection pads 130 may be disposed to correspond to the connection lines 115 which are disposed in the recessed portion TP.

The contact pads CP1 of the flexible printed circuit boards SFPC1 may be electrically connected to the connection pads 130 through the adhesive films 400.

As described above, the connection lines 115 and the connection pads 130 may contact each other at the inner side IS of the reference line RL through the recessed portions TP so that it is possible to effectively prevent an opening (or disconnection) between the connection lines 115 and the connection pads 130.

Figure 10:
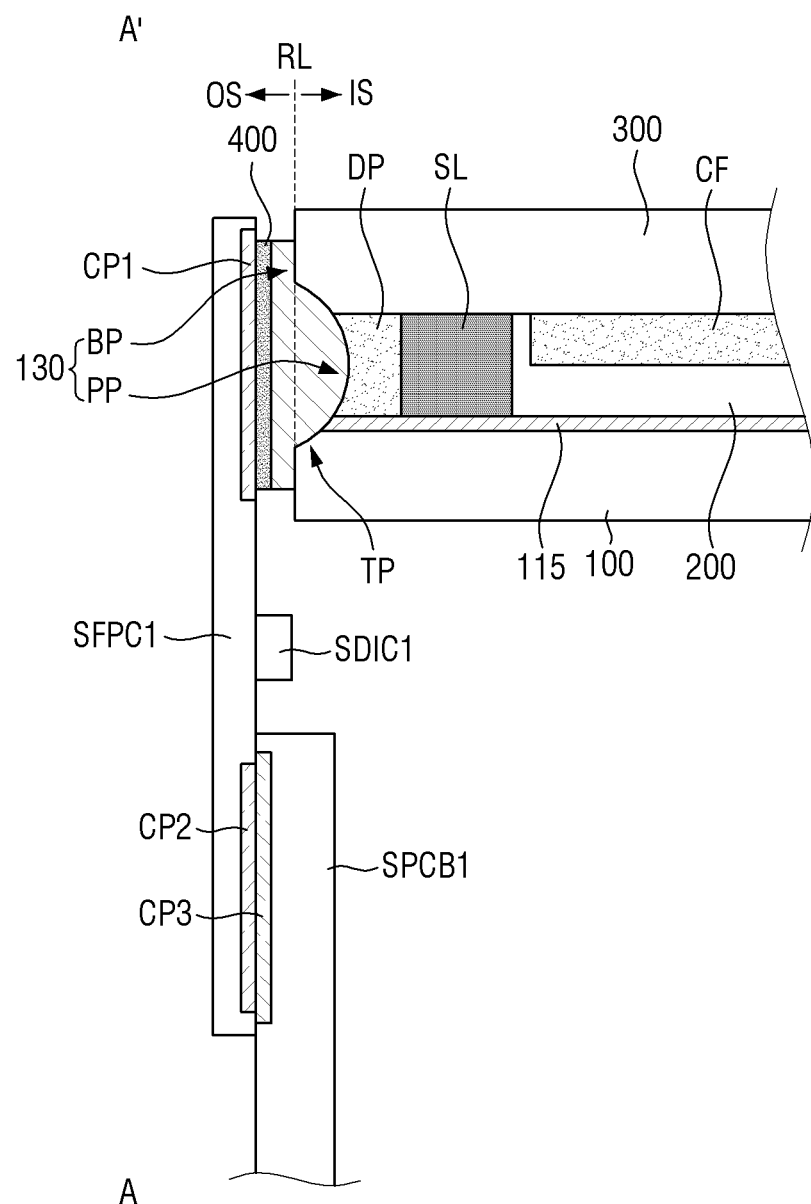
FIG. 10 is a schematic cross-sectional view taken along line A-A' of FIG. 2 according to another embodiment.

FIG. 10 is a schematic cross-sectional view taken along line A-A' of FIG. 2 according to another embodiment. A display device of FIG. 10 has a structure identical to the structure of FIG. 4 except for a shape of a connection pad. Hereinafter, repetitive descriptions thereof will be omitted.

Referring to FIG. 10, at least one side of a display device 1 may include a recessed portion TP, and a connection pad 130 may be disposed to cover or overlap the recessed portion TP. The connection pad 130 may include a first portion BP disposed to be flat at the outer side OS of the reference line RL in the third direction DR3, and a second portion PP convexly protruding from the first portion BP toward the inner side IS of the reference line RL. For example, the connection pads 130 may include the second portion PP filling the recessed portion TP with the first portion BP as a base thereof, and the second portion PP may contact a connection line 115 at the inner side IS of the reference line RL to be electrically connected to the connection line 115.

A surface of the first portion BP of the connection pads 130, which is opposite to a surface on which the second portion PP is disposed, may be formed to be flat so that an area bonding with an adhesive film 400 is increased, thereby stably being connected to the flexible printed circuit board SFPC1.

Figure 11:
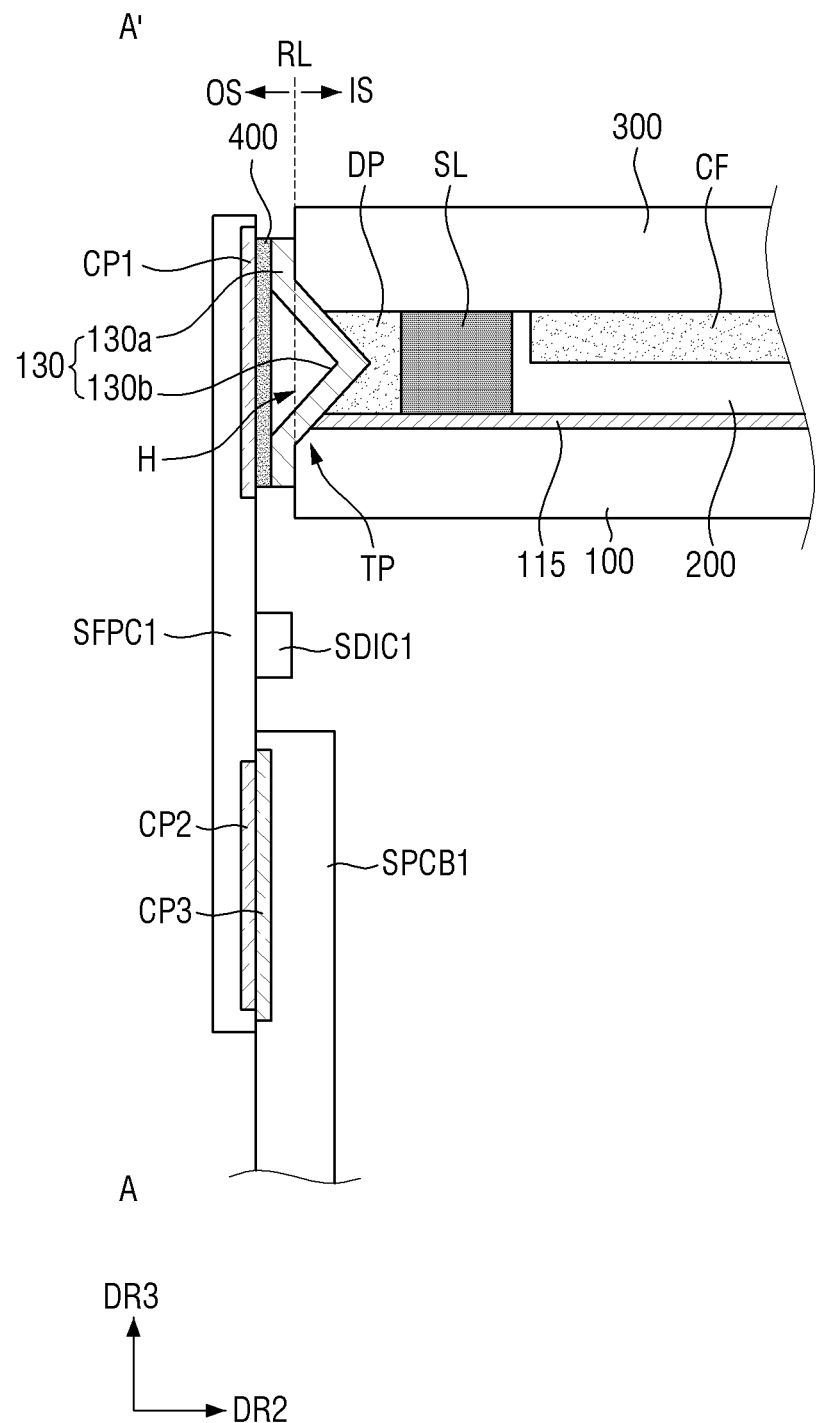
FIG. 11 is a schematic cross-sectional view taken along line A-A' of FIG. 2 according to still another embodiment.
Figure 12:
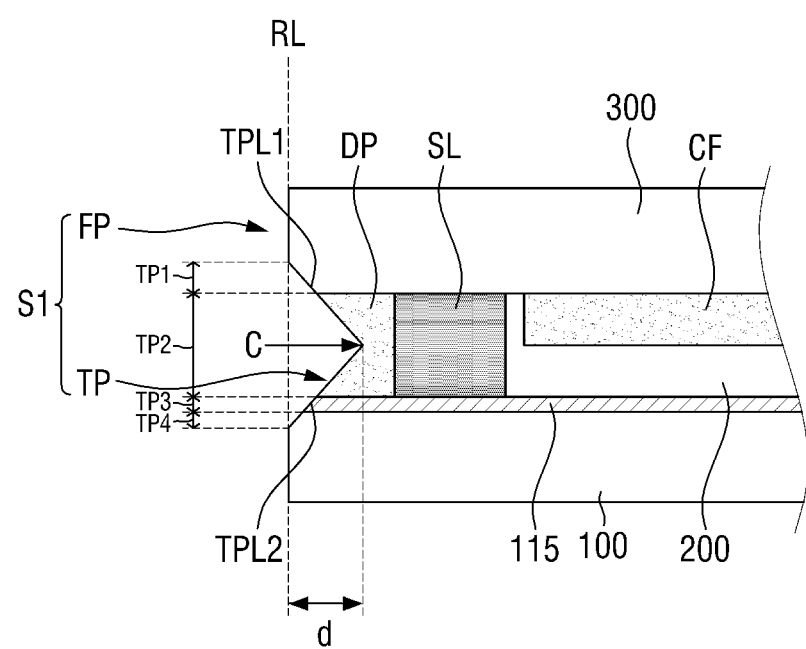
FIG. 12 is a schematic cross-sectional view illustrating a portion of FIG. 10 to describe a recessed portion.

FIG. 11 is a schematic cross-sectional view taken along line A-A' of FIG. 2 according to still another embodiment, and FIG. 12 is a schematic cross-sectional view illustrating a portion of FIG. 10 to describe a recessed portion.

Display devices of FIGS. 11 and 12 have structures identical to the structures of FIGS. 4 and 5 except for shapes of a recessed portion and a connection pad. Hereinafter, repetitive descriptions thereof will be omitted.

Referring to FIGS. 11 and 12, at least one side surface S1 of a display device 1 may include a flat portion FP and a recessed portion TP. For example, the recessed portion TP may be formed from the flat portion FP of the side surface S1 of the display device 1 in a direction (for example, the second direction DR2) toward a central portion of the display device 1. The flat portion FP may serve as a buffer to prevent damage to side surfaces of a first substrate 100 and a second substrate 300 in which the recessed portion TP is disposed because of an external impact.

The recessed portion TP may have a form in which portions of the first substrate 100, the connection line 115, a dummy pattern DP, and the second substrate 300 are polished. For example, the recessed portion TP may have a prism shape disposed over the first substrate 100, a connection line 115, a dummy pattern DP, and the second substrate 300 based on a cross section taken along line A-A'. However, the disclosure is not limited thereto, and the recessed portion TP may be disposed over some of the first substrate 100, the connection line 115, the dummy pattern DP, and the second substrate 300. For example, the recessed portion TP may be formed by polishing portions of the first substrate 100, the connection line 115, and the dummy pattern DP or may be formed by polishing portions of the second substrate 300, the dummy pattern DP, and the connection line 115.

Owing to the recessed portion TP, portions of the side surfaces of the first substrate 100 and the second substrate 300 form constantly inclined surfaces, and expose bare glass, and an end of the connection line 115 may be exposed inside the reference line RL. The end of the connection line 115 may have an inclined cross section because of the recessed portion TP.

For example, the recessed portion TP may include first and second inclined surfaces TPL1 and TPL2 which are inclined from an end of a flat portion FP of each of the first and second substrates 100 and 300 toward a central portion C of the recessed portion TP. A depth d of the recessed portion TP may increase toward the central portion C where the first inclined surface TPL1 and the second inclined surface TPL2 meet each other, and the central portion C may be located at a center of the dummy pattern DP, but the disclosure is not limited thereto, and the position of the central portion C may be biased toward either the first substrate 100 or the second substrate 300. For example, a cross section of the recessed portion TP may have various shapes such as an equilateral triangle, an isosceles triangle, and a right-angled triangle.

To describe a shape of the recessed portion TP in detail, the recessed portion TP may include first to fourth regions TP1, TP2, TP3, and TP4. For example, the recessed portion TP may include the first region TP1 exposing the bare glass of the second substrate 300, the second region TP2 disposed between the first substrate 100 and the second substrate 300, a third region TP3 exposing the end of the connection line 115, and a fourth region TP4 exposing the bare glass of the first substrate 100. Here, the component exposed by the second region TP2 of the recessed portion TP may vary according to a component disposed at an edge between the first substrate 100 and the second substrate 300. In an embodiment, since the dummy pattern DP is disposed, the dummy pattern DP may be exposed by the second region TP2 of the recessed portion TP, and the recessed portion TP and a sealant SL may be disposed to be spaced apart from each other. However, in case that the dummy pattern DP is omitted, the sealant SL may be exposed by the recessed portion TP.

The first inclined surface TPL1 may be formed by the first and second regions TP1 and TP2 of the recessed portion TP, the second inclined surface TPL2 may be formed by the third and fourth regions TP3 and TP4 of the recessed portion TP, and the first inclined surface TPL1 and the second inclined surface TPL2 may be symmetrical, but the disclosure is not limited thereto, and the first inclined surface TPL1 and the second inclined surface TPL2 may be asymmetrical.

Here, the component exposed by the second region TP2 of the recessed portion TP may vary according to a component disposed at an edge between the first substrate 100 and the second substrate 300. In an embodiment, since the dummy pattern DP is disposed, the dummy pattern DP having a side surface recessed in a prism shape may be exposed by the second region TP2 of the recessed portion TP, and the recessed portion TP and a sealant SL may be disposed to be spaced apart from each other. However, in case that the dummy pattern DP is omitted, the sealant SL having a side surface recessed in a prism shape by the recessed portion TP may be exposed.

The connection pad 130 may be disposed to cover or overlap the recessed portion TP. For example, the connection pad 130 may include a first portion 130a disposed on the flat portion FP of the side surface S1 of the display device 1, and a second portion 130b disposed on the recessed portion TP. The first portion 130a may be disposed on an outer side OS of the reference line RL, and the second portion 130b may be disposed on an inner side IS of the reference line RL, but the disclosure is not limited thereto, and shapes of the first portion 130a and the second portion 130b may be variously modified according to a material forming the connection pad 130 and a manufacturing process thereof.

More specifically, the second portion 130b of the connection pad 130 may be disposed on the first inclined surface TPL1 and the second inclined surface TPL2. For example, the second portion 130b may be disposed along the first inclined surface TPL1 formed by the first and second regions TP1 and TP2 and the second inclined surface TPL2 formed by the third and fourth regions TP3 and TP4 of the recessed portion TP.

The connection pad 130 may directly contact the bare glass of the second substrate 300 exposed by the first region TP1 of the of the recessed portion TP, a side surface of the dummy pattern DP exposed by the second region TP2 of the recessed portion TP between the first substrate 100 and the second substrate 300, the end of the connection line 115 exposed by the third region TP3 of the recessed portion TP, and the bare glass of the first substrate 100 exposed by the fourth region TP4 of recessed portion TP and may be disposed along the morphology of the recessed portion TP.

Therefore, the second portion 130b of the connection pad 130 may be electrically connected to the end of connection line 115 which is exposed by the third region TP3 of the recessed portion TP at the inner side IS of the reference line RL. The connection pad 130 may be made of Al or Ag, but the disclosure is limited thereto.

The adhesive film 400 may be disposed outside the connection pad 130. The adhesive film 400 may electrically connect the connection pad 130 to a contact pad CP1 of the flexible printed circuit board SFPC1. Since the connection pad 130 is disposed along the morphology of the recessed portion TP, a void H may be formed between the connection pad 130 and the adhesive film 400 to correspond to the recessed portion TP. However, the disclosure is not limited thereto, and the adhesive film 400 may be disposed along the morphology of the connection pad 130.

In another embodiment, the connection pads 130 and the contact pad CP1 may directly contact each other without the adhesive film 400 to be electrically connected. For example, the connection pads 130 and the contact pad CP1 may be directly connected by an ultrasonic bonding method or a welding method.

As described above, since the recessed portion TP may be disposed on at least one side surface S1 of the display device 1 so that the connection line 115 and the connection pad 130 may contact each other in the inner side IS of the reference line RL, in a polishing process in which the first substrate 100 and the second substrate 300 are coplanarly disposed, it is possible to effectively prevent the connection line 115 from being damaged and to effectively prevent the connection line 115 and the connection pads 130 from being open because of foreign materials that are generated and accumulated on the connection line 115 during the polishing process.

Figure 13:
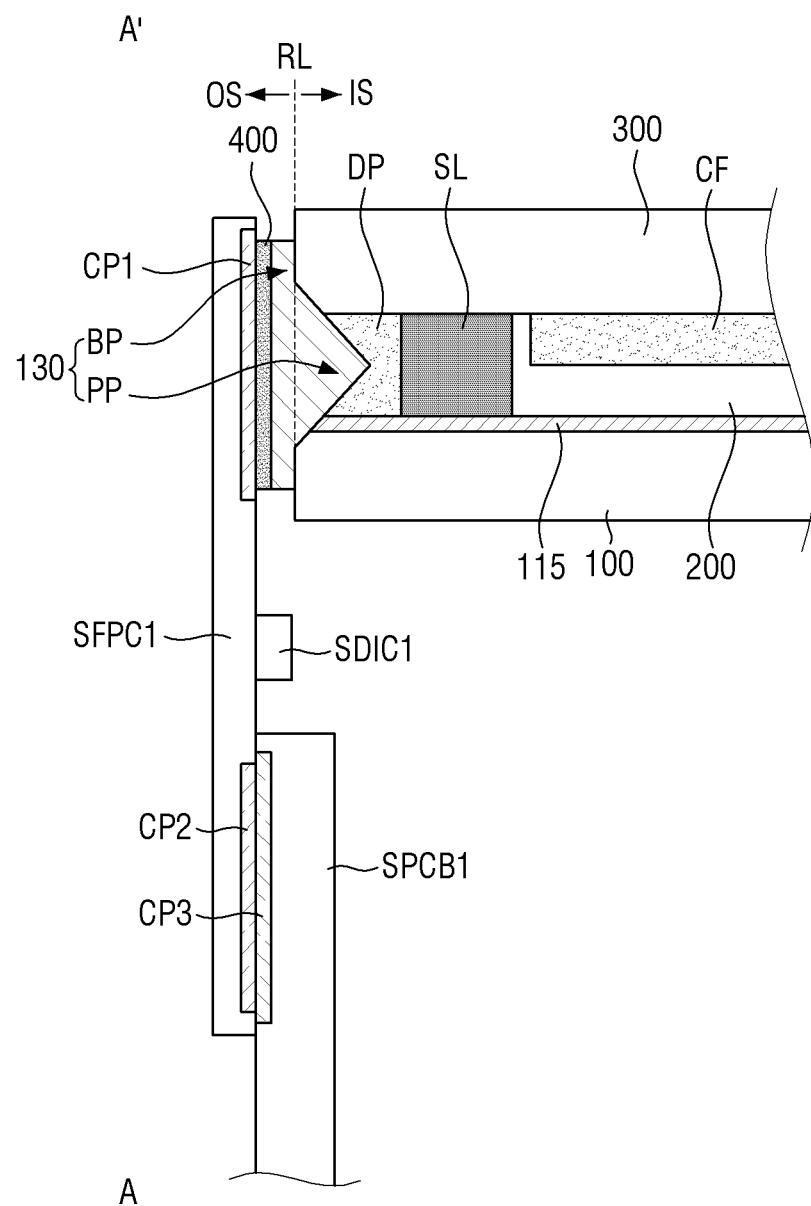
FIG. 13 is a schematic cross-sectional view taken along line A-A' of FIG. 2 according to still another embodiment.

FIG. 13 is a schematic cross-sectional view taken along line A-A' of FIG. 2 according to still another embodiment. A display device of FIG. 13 may have a structure identical to the structure of FIG. 11 except for a shape of a connection pad. Hereinafter, repetitive descriptions thereof will be omitted.

Referring to FIG. 13, at least one side of a display device 1 may include a recessed portion TP, and a connection pad 130 may be disposed to cover or overlap the recessed portion TP. The connection pad 130 may include a first portion BP disposed to be flat in the outer side OS of the reference line RL in the third direction DR3, and a second portion PP of a prism shape protruding from the first portion BP toward the inner side IS of the reference line RL. For example, the connection pad 130 may include the second portion PP filling the recessed portion TP with the first portion BP as the base thereof, and the second portion PP may contact a connection line 115 of a first substrate 100 in the inner side IS of the reference line RL to be electrically connected to the connection line 115.

A surface of the first portion BP of the connection pad 130, which is opposite to a surface of the first portion BP on which the second portion PP is disposed, may be formed to be flat so that an area bonding with an adhesive film 400 may be increased, thereby being stably connected to the flexible printed circuit board SFPC1.

Hereinafter, a method of manufacturing the above-described display device will be described.

FIGS. 14 to 24 are schematic cross-sectional views illustrating a method of manufacturing a display device according to an embodiment. Components which are substantially identical to those in FIG. 4 will be denoted by the same reference numerals, and detailed descriptions thereof will be omitted.

Figure 14:
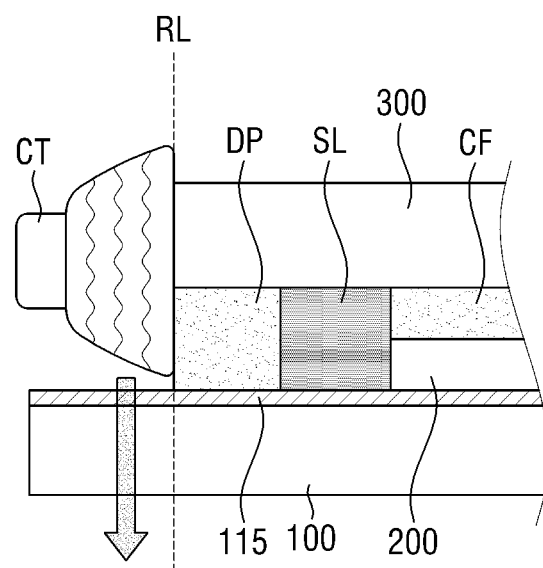
FIGS. 14 to 24 are schematic cross-sectional views illustrating a method of manufacturing a display device according to an embodiment of the disclosure.
Figure 14:
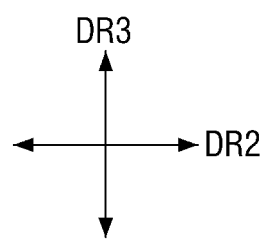
Figure 15:
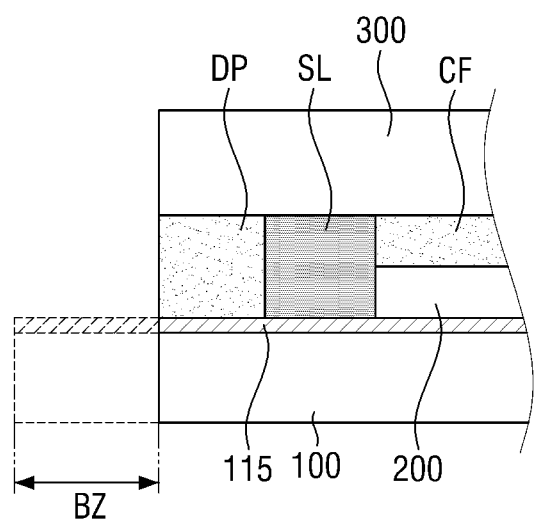

Referring to FIGS. 14 and 15, a first polishing process of polishing a side surface of the display device 1 in the third direction DR3 is shown. A polishing process may be performed by one among physical polishing, chemical polishing, chemical mechanical polishing, and electro-polishing, and the physical polishing process will be described as an embodiment.

The display device 1 may be formed using the first and second substrates 100 and 300 which are bonded to each other with the liquid crystal layer 200 interposed therebetween. The first substrate 100 may protrude outward from the second substrate 300, and the first substrate 100 may be polished using the reference line RL extending from a side surface of the second substrate 300 in the third direction DR3 as a polishing angle. For example, the display device 1 may be fixed to a polishing table, and a polishing device CT may be moved along the reference line RL connecting the outer surface 100a (see FIG. 5) of the first substrate 100 to the outer surface 300a (see FIG. 5) of the second substrate 300 in the third direction DR3 to polish the first substrate 100. Therefore, the side surfaces of the first substrate 100 and the second substrate 300 may be aligned along the reference line RL, and a bezel BZ formed by the first substrate 100 protruding outward from the second substrate 300 may be removed. As the first substrate 100 is polished, the connection line 150 formed on the first substrate 100 may also be polished along the reference line RL. In case that the first and second substrates 100 and 300 are formed to have the same size in the manufacturing process of the display device 1, the first polishing process may be omitted.

Figure 16:
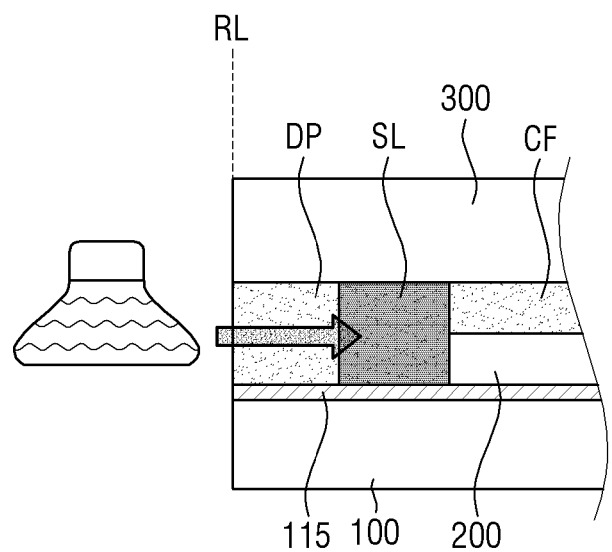
Figure 17:
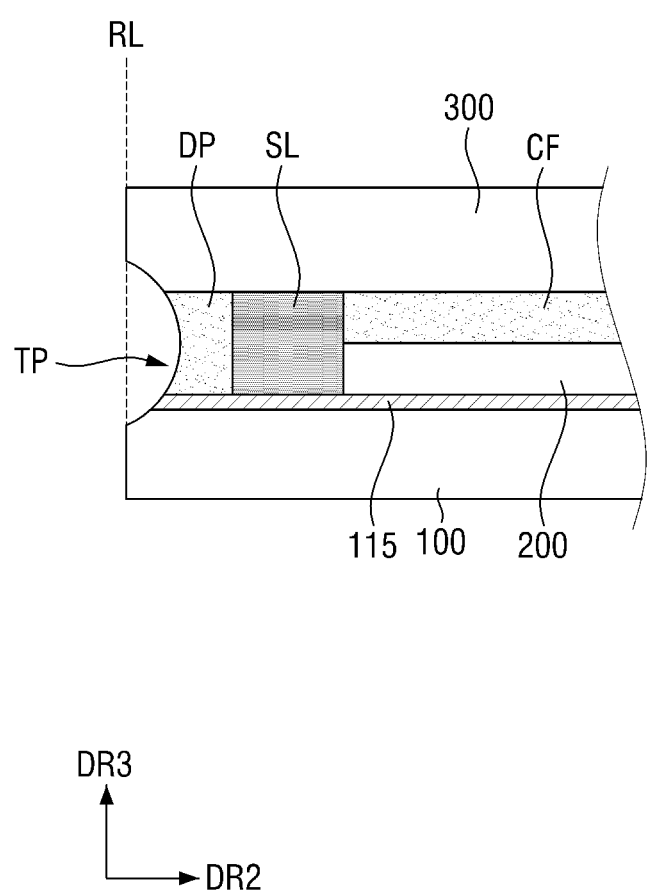

Referring to FIGS. 16 and 17, a second polishing process, in which the side surfaces of the first and second substrates 100 and 300 aligned along the reference line RL are polished in the second direction DR2, is shown. For example, portions of the first and second substrates 100 and 300, the connection line 115, and the dummy pattern DP may be polished in the second direction DR2 by the polishing device CT to form the recessed portion TP at a side of the display device 1. Owing to the recessed portion TP, bare glass of the second substrate 300 is exposed, a predetermined groove may be formed in the dummy pattern DP, and an end of the connection line 115 may be exposed inside the reference line RL, and bare glass of the first substrate 100 may be exposed.

Figure 18:
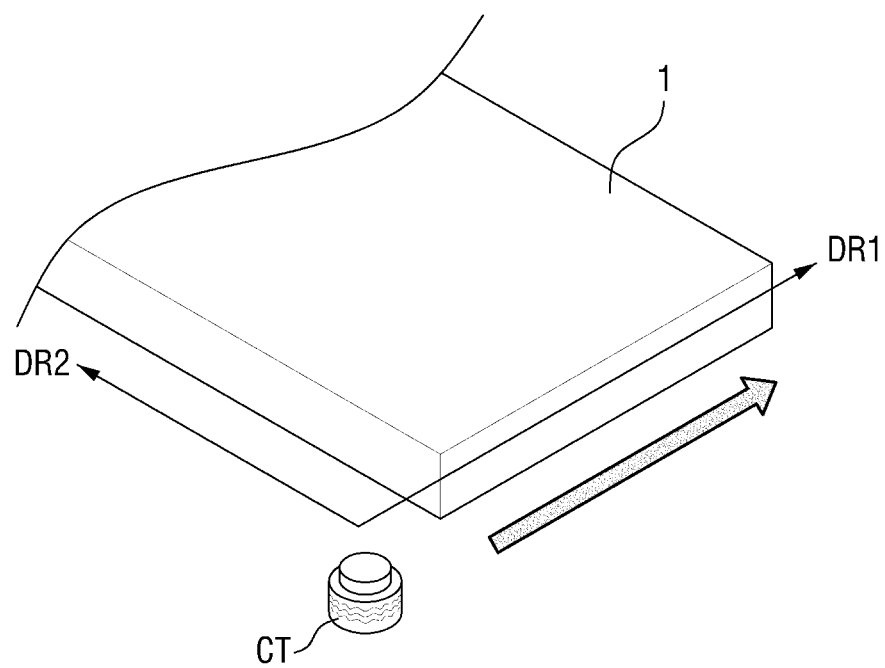
Figure 19:
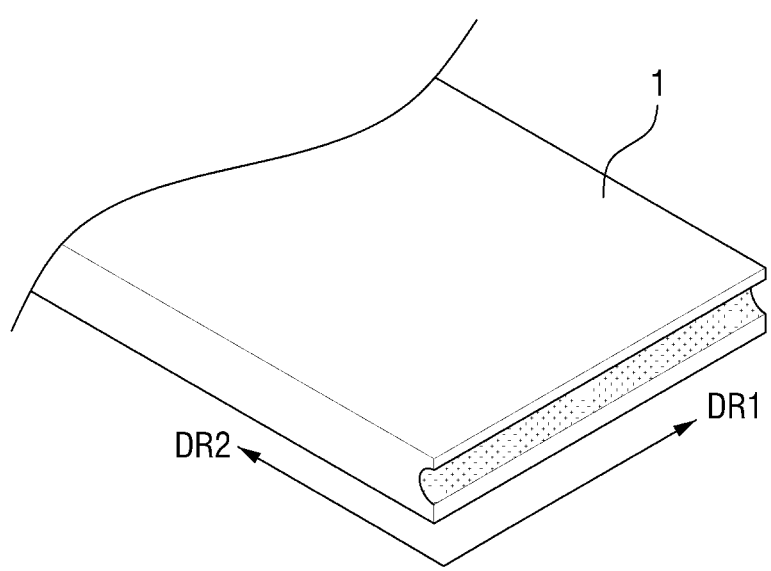

Referring to FIGS. 18 and 19, in an embodiment, the second polishing process may be performed in the second direction DR2 using the polishing device CT and, simultaneously, may be performed by moving the polishing device CT in the first direction DR1. Therefore, it is possible to form the recessed portion TP in the form of a bar extending in the first direction DR1. As described above, a depth of the recessed portion TP may be determined in response to a pressure in the second direction DR2, and a length of the recessed portion TP may be determined according to progression of the polishing process in the first direction DR1.

Figure 20:
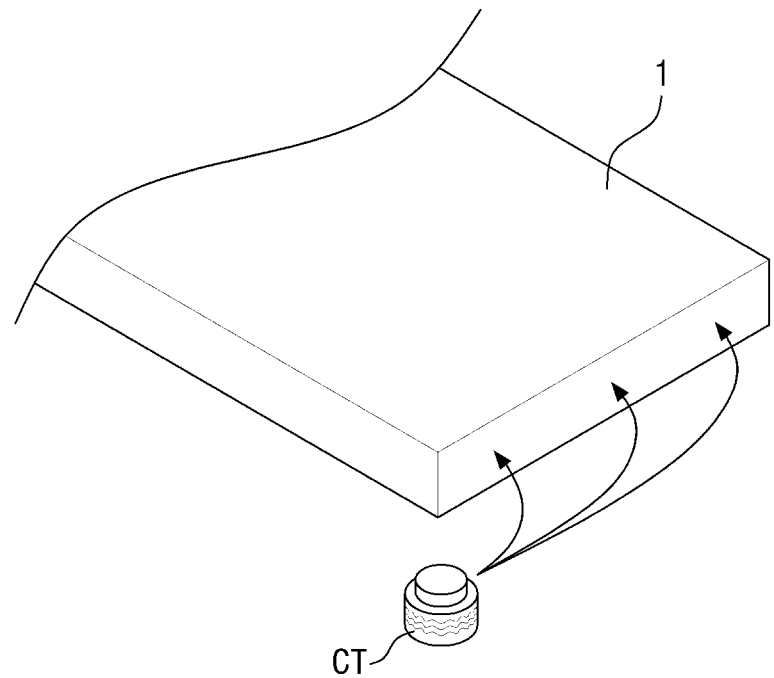
Figure 21:
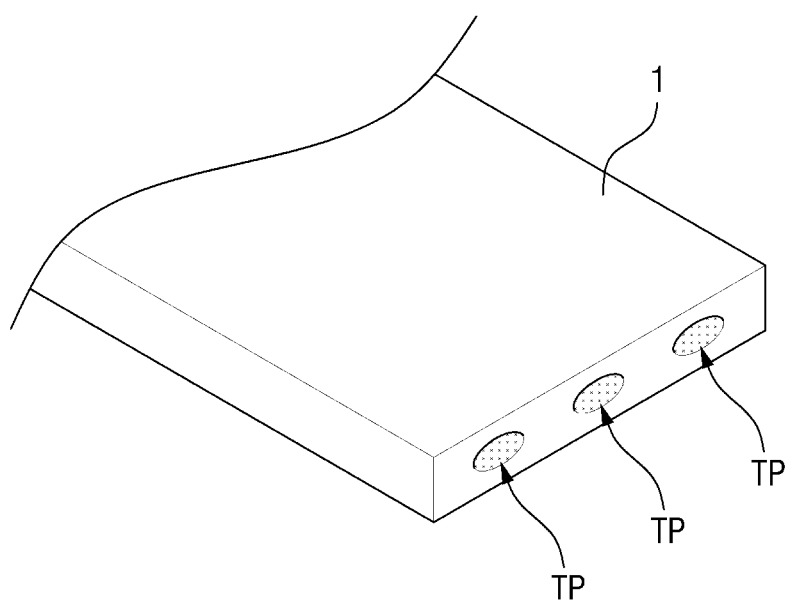

Referring to FIGS. 20 and 21, in another embodiment, the side surface of the display device 1 may be partially polished. In the embodiment, three recessed portions TP have been formed on a side surface of the display device 1, but the disclosure is not limited thereto. As described above, recessed portions TP spaced apart from each other may be formed by applying a pressure to a part of the side surface of the display device 1 in the second direction DR2 by the polishing device CT.

Figure 22:
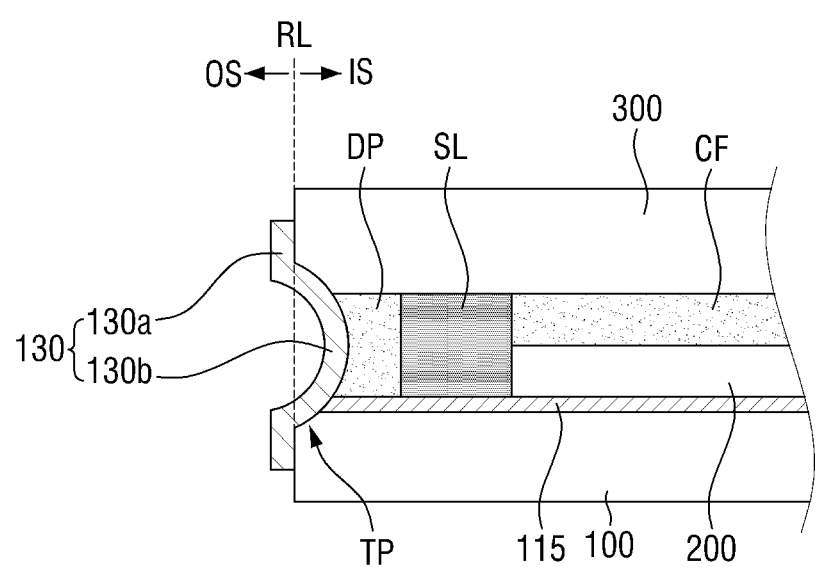

Referring to FIG. 22, the connection pad 130 may be formed on a side surface of the display device 1. For example, the connection pad 130 may be formed in a shape corresponding to the side surface of the display device 1 on which the recessed portion TP is formed. For example, the connection pad 130 may be formed by forming a connection pad layer by a plating or sputtering method using Al or Ag and patterned patterning the connection pad layer. Therefore, the connection pad 130 may include a first portion BP disposed to be flat at the outer side OS of the reference line RL in the third direction DR3 and a second portion PP convexly protruding from the first portion BP toward the inner side IS of the reference line RL. The second portion PP may contact the connection line 115 and be electrically connected thereto in the inner side IS of the reference line RL.

As described above, since the recessed portion TP is disposed on at least one side surface S1 of the display device 1 so that the connection line 115 and the connection pad 130 may contact each other in the inner side IS of the reference line RL, in a polishing process in which the first substrate 100 and the second substrate 300 are coplanarly arranged, it is possible to effectively prevent the connection line 115 from being damaged and to effectively prevent the connection line 115 and the connection pads 130 from being open because of foreign materials that are generated and accumulated on the connection line 115 during the polishing process.

Figure 23:
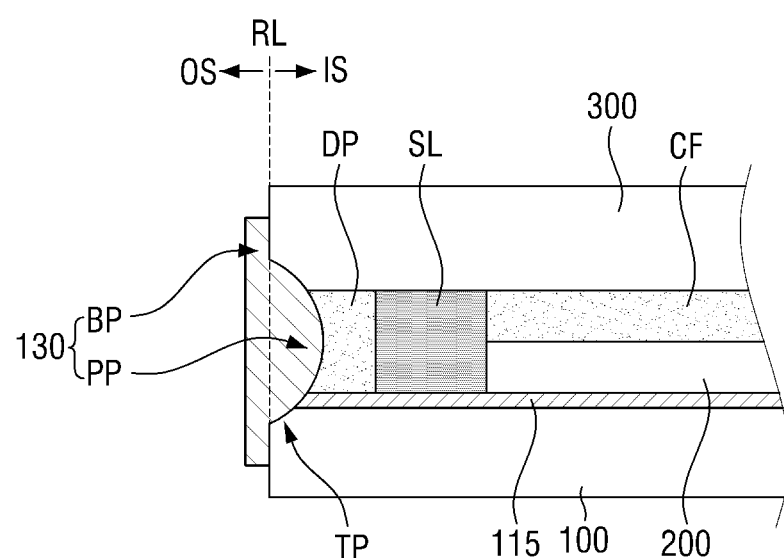
Figure 23:
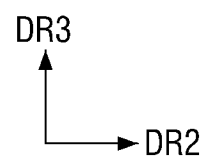

Referring to FIG. 23, in another embodiment, the connection pad layer may be formed by a process of applying and curing a conductive paste such as Al or Ag, and the connection pad layer may be patterned to form the connection pad 130. Therefore, the connection pad 130 may include a first portion BP disposed to be flat at the outer side OS of the reference line RL in the third direction DR3 and a second portion PP convexly protruding from the first portion BP toward the inner side IS of the reference line RL, and a surface of the first portion BP of the connection pads 130, which is opposite to a surface of the first portion BP on which the second portion PP is disposed, may be formed to be flat to be stably connected to a flexible printed circuit board SFPC1.

Figure 24:
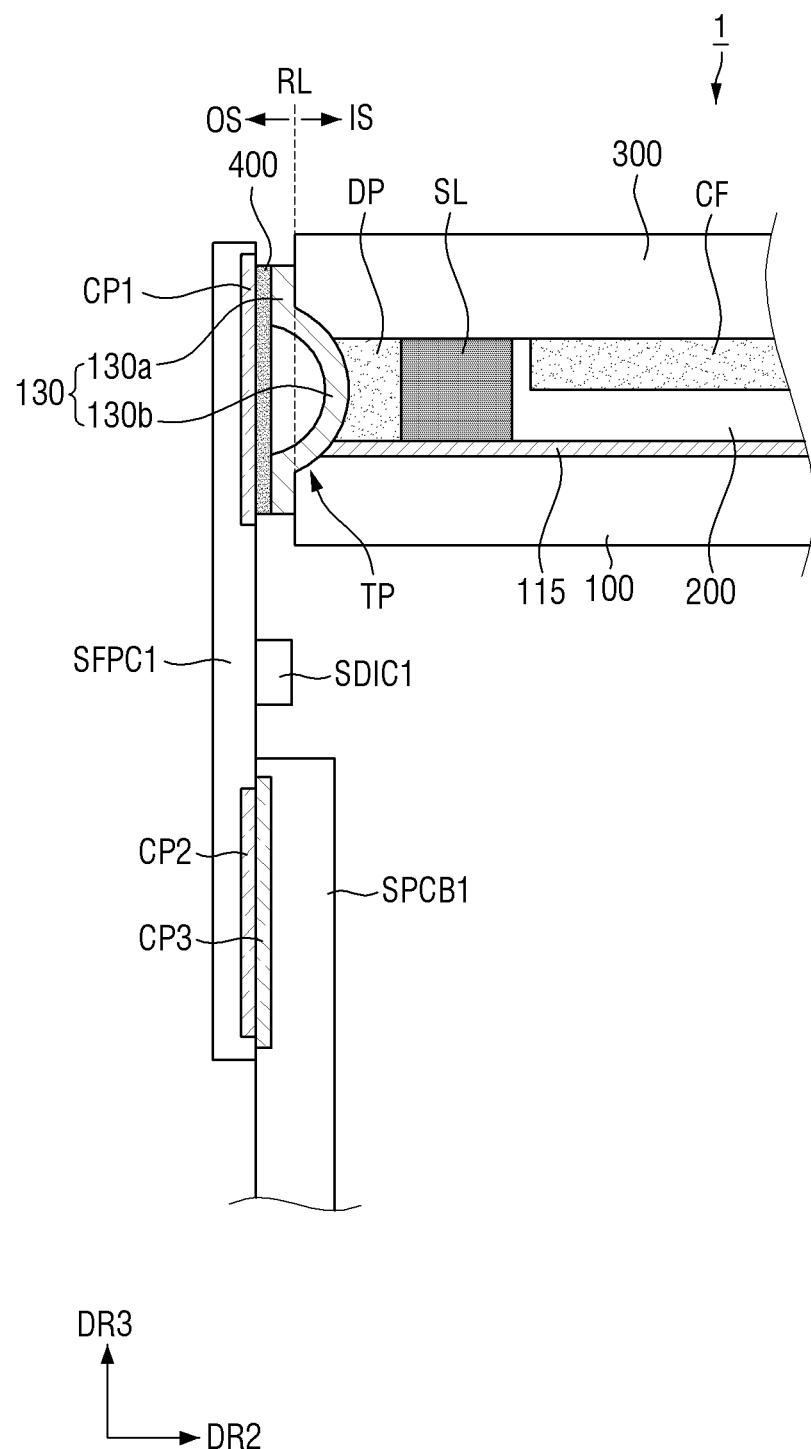

Referring to FIG. 24, a flexible printed circuit board SFPC1 to which a driving printed circuit board SPCB1 is connected may be bonded to a side of the display device 1 on which a connection pad 130 is formed.

While the embodiments of the disclosure have been described with reference to the accompanying drawings, those skilled in the art would understand that the disclosure can be implemented in other specific forms without departing from the technical spirit or the necessary features of the disclosure. Therefore, it should be understood that the above-described embodiments are not restrictive but illustrative in all aspects.

What is claimed is:

1. A display device comprising:
a first substrate including a connection line;
a second substrate facing the first substrate; and
a connection pad connected to a side surface of the first substrate and a side surface of the second substrate,
wherein the connection pad includes:
    a first portion contacting the side surface of the first substrate and the side surface of the second substrate, and
    a second portion disposed inside in each of the first substrate and the second substrate and contacting the connection line.

2. The display device of claim 1, wherein the one-side surface of the first substrate and the t side surface of the second substrate are arranged in a first direction perpendicular to upper surfaces of the first substrate and the second substrate.

3. The display device of claim 2, wherein an end of the connection line is disposed in each of the first substrate and the second substrate which are arranged in the first direction.

4. The display device of claim 3, further comprising a recessed portion disposed on the side surface of the first substrate and the side surface of the second substrate.

5. The display device of claim 4, wherein:
each of the first substrate and the second substrate includes glass; and
the recessed portion includes a first region exposing a surface of the glass of the first substrate and a second region exposing a surface of the glass of the second substrate.

6. The display device of claim 5, wherein the recessed portion includes a third region disposed between the first region and the second region and exposing the end of the connection line which is disposed in each of the first substrate and the second substrate.

7. The display device of claim 6, further comprising a dummy pattern disposed between the first substrate and the second substrate,
wherein the recessed portion includes a fourth region disposed between the first region and the third region and exposing the dummy pattern.

8. The display device of claim 7, wherein the second portion of the connection pad is disposed along a morphology of the first to fourth regions.

9. The display device of claim 8, wherein the second portion of the connection pad contacts the surface of the glass of each of the first substrate and the second substrate.

10. The display device of claim 9, wherein the second portion of the connection pad contacts each of the end of the connection line and the dummy pattern.

11. The display device of claim 7, wherein
the first portion of the connection pad is a flat portion extending in the first direction, and
the second portion of the connection pad protrudes inward from each of the first substrate and the second substrate.

12. The display device of claim 11, wherein the second portion of the connection pad contacts the surface of the glass of each of the first substrate and the second substrate.

13. The display device of claim 12, wherein the second portion of the connection pad contacts each of the end of the connection line and the dummy pattern.

14. A display device comprising:
a first substrate;
a second substrate facing the first substrate;
a sealing member disposed along an edge region of the first substrate and an edge region of the second substrate and connect the first substrate to the second substrate; and
a liquid crystal layer disposed between the first substrate and the second substrate in an inner region of the sealing member, wherein
the first substrate includes a first inclined surface which is inclined with respect to each of a first side surface and an upper surface in a first corner region in which the first side surface disposed outside the sealing member and the upper surface facing the second substrate meet each other, and
the second substrate includes a second inclined surface which is disposed outside the sealing member and is inclined with respect to a second side surface and a lower surface in a second corner region in which the second side surface aligned with the first side surface and the lower surface facing the first substrate meet each other.

15. The display device of claim 14, further comprising a dummy pattern disposed outside the sealing member, wherein
the first substrate includes a first inflection point where the first inclined surface meets the upper surface of the first substrate,
the second substrate includes a second inflection point where the second inclined surface meets the lower surface of the second substrate, and
the dummy pattern is disposed in a space between the sealing member and an inflection reference line that is a straight line connecting the first inflection point to the second inflection point.

16. The display device of claim 15, wherein an outer surface of the dummy pattern includes,
a first inclined region extending from the first inclined surface; and a second inclined region extending from the second inclined surface.

17. The display device of claim 15, wherein:
the first inclined surface has a first curvature;
the second inclined surface has a second curvature;
the outer surface of the dummy pattern includes a first concave region extending from the first inclined surface and having the first curvature; and
the outer surface of the dummy pattern includes a second concave region extending from the second inclined surface and having the second curvature.

18. The display device of claim 17, wherein the first curvature is equal to the second curvature.

19. The display device of claim 15, further comprising a line disposed on the first substrate, the line including an end aligned with the first inflection point.

20. The display device of claim 15, further comprising a conductive pattern disposed on the first substrate and the second substrate along the first side surface, the first inclined surface, the second inclined surface, and the second side surface.

* * * * *